United States Patent
Tochigi et al.

(10) Patent No.: US 11,330,202 B2
(45) Date of Patent: May 10, 2022

(54) SOLID-STATE IMAGE SENSOR, IMAGING DEVICE, AND METHOD OF CONTROLLING SOLID-STATE IMAGE SENSOR

(71) Applicant: SONY SEMICONDUCTOR SOLUTIONS CORPORATION, Kanagawa (JP)

(72) Inventors: Yasuhisa Tochigi, Kanagawa (JP); Takafumi Takatsuka, Kanagawa (JP); Hongbo Zhu, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/964,059

(22) PCT Filed: Dec. 14, 2018

(86) PCT No.: PCT/JP2018/046044
§ 371 (c)(1),
(2) Date: Jul. 22, 2020

(87) PCT Pub. No.: WO2019/150785
PCT Pub. Date: Aug. 8, 2019

(65) Prior Publication Data
US 2021/0051279 A1 Feb. 18, 2021

(30) Foreign Application Priority Data
Feb. 2, 2018 (JP) .............................. JP2018-017018

(51) Int. Cl.
*H04N 5/225* (2006.01)
*H04N 5/353* (2011.01)
*H04N 5/3745* (2011.01)

(52) U.S. Cl.
CPC ............ *H04N 5/353* (2013.01); *H04N 5/3745* (2013.01)

(58) Field of Classification Search
None
See application file for complete search history.

(56) References Cited

U.S. PATENT DOCUMENTS

2011/0235771 A1* 9/2011 Aull .................. H04N 5/37455
377/19
2012/0057059 A1 3/2012 Eldesouki et al.
(Continued)

FOREIGN PATENT DOCUMENTS

CN 104702861 A 6/2015
CN 104885222 A 9/2015
(Continued)

OTHER PUBLICATIONS

Extended European Search Report of EP Application No. 18903793.0, dated Oct. 20, 2020, 09 pages.
(Continued)

*Primary Examiner* — Jason A Flohre
*Assistant Examiner* — Dwight Alex C Tejano
(74) *Attorney, Agent, or Firm* — Chip Law Group

(57) ABSTRACT

To reduce power consumption in a solid-state image sensor that measures a time. The solid-state image sensor includes a count unit, a count control unit, a clock unit, and an estimation unit. The count unit counts the number of times a photon has been incident within a predetermined exposure period, and outputs a count value. The count control unit performs control to stop the count unit and performs a request of time information in a case where the count value has reached a predetermined value before the predetermined exposure period elapses. The clock unit measures a time and outputs the time information in response to the request. The (Continued)

estimation unit estimates the number of incident times of a photon within the predetermined exposure period on the basis of the output time information.

11 Claims, 28 Drawing Sheets

(56) References Cited

U.S. PATENT DOCUMENTS

| | | | |
|---|---|---|---|
| 2015/0115163 A1 | 4/2015 | Nishihara et al. | |
| 2015/0163429 A1* | 6/2015 | Dai | H04N 5/3535 348/295 |
| 2015/0281620 A1 | 10/2015 | Usuda et al. | |
| 2015/0369929 A1 | 12/2015 | Durst et al. | |
| 2017/0131143 A1* | 5/2017 | Andreou | H01L 31/02027 |
| 2017/0263798 A1 | 9/2017 | Suzuki et al. | |
| 2020/0351464 A1* | 11/2020 | Ikedo | H04N 5/37455 |

FOREIGN PATENT DOCUMENTS

| | | |
|---|---|---|
| EP | 3158363 A2 | 4/2017 |
| JP | 09-189604 A | 7/1997 |
| JP | 6145655 B2 | 6/2017 |
| JP | 2017-521682 A | 8/2017 |
| JP | 2017-163046 A | 9/2017 |
| JP | 2018-013422 A | 1/2018 |
| JP | 6573667 B2 | 9/2019 |
| TW | 201523843 A | 6/2015 |
| WO | 2013/157448 A1 | 10/2013 |
| WO | 2014/097519 A1 | 6/2014 |
| WO | 2015/196074 A2 | 12/2015 |
| WO | 2018/016345 A1 | 1/2018 |

OTHER PUBLICATIONS

International Search Report and Written Opinion of PCT Application No. PCT/JP2018/046044, dated Mar. 19, 2019, 10 pages of ISRWO.

* cited by examiner

FIG. 9

| EXPOSURE CONTROL SIGNAL | DETERMINATION RESULT | OPERATION OF PHOTON COUNTER |
|---|---|---|
| 0 (OUTSIDE EXPOSURE PERIOD) | DEC=0 (CNT<Lim) | COUNT STOP |
| | DEC=1 (CNT=Lim) | COUNT STOP |
| 1 (WITHIN EXPOSURE PERIOD) | DEC=0 (CNT<Lim) | COUNT OPERATION |
| | DEC=1 (CNT=Lim) | COUNT STOP |

FIG. 10

| COUNT VALUE CNT | OUTPUT SIGNAL |
|---|---|
| DEC=0<br>(CNT<Lim) | DETERMINATION RESULT DEC=0<br>REQUEST Req=0 |
| DEC=1<br>(CNT=Lim) | DETERMINATION RESULT DEC=1<br>REQUEST Req=1 |

FIG. 11

| DETERMINATION RESULT | OPERATION OF ESTIMATION UNIT |
|---|---|
| DEC=0 (CNT<Lim) | — (CALCULATION STOP) |
| DEC=1 (CNT=Lim) | $EST = L1 \times (Ts/Tc)$ |

FIG. 21

| COUNT VALUE CNT | OUTPUT SIGNAL |
|---|---|
| $CNT < Pre (< Lim)$ | DETERMINATION RESULT DEC = 0<br>REQUEST Req = 0 |
| $Pre \leq CNT < Lim$ | DETERMINATION RESULT DEC = 0<br>REQUEST Req = 1 |
| $CNT = Lim$ | DETERMINATION RESULT DEC = 1<br>REQUEST Req = 0 |

SOLID-STATE IMAGE SENSOR, IMAGING DEVICE, AND METHOD OF CONTROLLING SOLID-STATE IMAGE SENSOR

CROSS REFERENCE TO RELATED APPLICATIONS

This application is a U.S. National Phase of International Patent Application No. PCT/JP2018/046044 filed on Dec. 14, 2018, which claims priority benefit of Japanese Patent Application No. JP 2018-017018 filed in the Japan Patent Office on Feb. 2, 2018. Each of the above-referenced applications is hereby incorporated herein by reference in its entirety.

TECHNICAL FIELD

The present technology relates to a solid-state image sensor, an imaging device, and a method of controlling a solid-state image sensor. More specifically, the present technology relates to a solid-state image sensor including a photon counter for counting the number of photons, an imaging device, and a method of controlling a solid-state image sensor.

BACKGROUND ART

Conventionally, solid-state image sensors for imaging image data have been used in imaging devices or the like. For example, a solid-state image sensor provided with a single-photon avalanche diode (SPAD), a photon counter, a threshold multiplexer circuit, and a timer is proposed (for example, see Patent Document 1). Here, the SPAD is an avalanche photodiode that is sensitive enough to detect the presence or absence of incidence of one photon. In this solid-state image sensor, the photon counter counts the number of photons over an exposure period and generates a count value. The timer continues to transmit time information indicating a timer value to a memory until the end of the exposure period. Furthermore, the threshold multiplexer circuit monitors the count value and stores the time information in the memory at the point of time when the count value has reached a predetermined threshold before the end of the exposure period. The time information is output as a pixel value, and a pixel array outside unit converts the pixel value into the number of measurements in an exposure time, whereby count value information equal to or larger than the threshold in a pixel can be obtained.

CITATION LIST

Patent Document

Patent Document 1: US 2012/057059 A

SUMMARY OF THE INVENTION

Problems to be Solved by the Invention

In the above-described solid-state image sensor, the timer transmits the time information to the memory in each pixel every time updating the timer value in the exposure period. For this reason, there is a problem that the number of transmission times of the time information from the timer to the memory becomes large, and power consumption of a transmission path between the timer and the memory increases in low illuminance in which the count value does not reach the predetermined threshold within the exposure period or the time to reach the threshold is long.

The present technology has been made in view of such a situation and has as an object to reduce power consumption in a solid-state image sensor that measures a time.

Solutions to Problems

The present technology has been made to solve the above-described problem, and a first aspect of the present technology is a solid-state image sensor and a method of controlling the solid-state image sensor, the solid-state image sensor including a count unit configured to count a number of times a photon has been incident within a predetermined exposure period and output a count value, a count control unit configured to perform control to stop the count unit and perform a request of time information in a case where the count value has reached a predetermined value before the predetermined exposure period elapses, a clock unit configured to measure a time and output the time information in response to the request, and an estimation unit configured to estimate a number of incident times of a photon within the predetermined exposure period on the basis of the output time information. This brings about an effect that the time information is output from the clock unit in response to the request.

Furthermore, in the first aspect, the count control unit may output a request requesting the time information to the clock unit in the request of the time information, and the count unit and the count control unit may be arranged in each of a plurality of pixel circuits arrayed in a two-dimensional lattice manner. This brings about an effect that the time information is output in response to the output of the request for each pixel circuit.

Furthermore, in the first aspect, the clock unit may output information indicating a time at which the request has been input by any one of the plurality of pixel circuits or a time to when the request is input from start of exposure as the time information.

Furthermore, in the first aspect, the predetermined value may include a limit value for limiting the count value and an immediately preceding value indicating the count value before reaching the limit value, the count control unit may perform control to continuously output the request to the clock unit during a period from when the count value has reached the immediately preceding value to when the count value has reached the limit value and control to stop the count unit when the count value has reached the limit value, the clock unit may output information indicating each time of times within the period in which the request is being input as the time information, and the estimation unit may estimate the number of incident times on the basis of the time information of when the count value has reached the limit value. This brings about an effect that the time information is continuously output during the period from when the count value has reached the immediately preceding value to when the count value has reached the limit value.

Furthermore, in the first aspect, the clock unit may include a plurality of time information generation units each configured to measure the time and generate the time information, and the plurality of pixel circuits may be respectively connected to the time information generation units different from each other. This brings about an effect that the time is measured by the time information generation unit arranged for each pixel circuit.

Furthermore, in the first aspect, the clock unit may include a plurality of time information generation units each configured to measure the time and generate the time information, and a plurality of lines each including a predetermined number of the pixel circuits arrayed in a predetermined direction may be respectively connected to the time information generation units different from each other. This brings about an effect that the time is measured by the time information generation unit arranged for each line.

Furthermore, in the first aspect, the clock unit may include a time information generation unit configured to measure the time and generate the time information, and the plurality of pixel circuits may be commonly connected to the time information generation unit. This brings about an effect that the time is measured by the time information generation unit shared by all the pixel circuits.

Furthermore, in the first aspect, a photodiode configured to detect presence or absence of incidence of one photon, and a resistor configured to return a potential of one end of the photodiode to an initial state every time the incidence of one photon is detected may be further included, and the count unit may count a number of times the potential of one end has varied due to the detection of the presence or absence of incidence of one photon. This brings about an effect that the number of times the potential of one end of the photodiode has varied is counted.

Furthermore, in the first aspect, the photodiode may be arranged on a light receiving chip, and the resistor, the count unit, the count control unit, and the estimation unit may be arranged on a logic chip stacked on the light receiving chip. This brings about an effect that the number of photons is counted by the count unit arranged on the logic chip together with the resistor, the count control unit, and the estimation unit.

Furthermore, in the first aspect, the photodiode and the resistor may be arranged on a light receiving chip, and the count unit, the count control unit, and the estimation unit may be arranged on a logic chip stacked on the light receiving chip. This brings about an effect that the number of photons is counted by the count unit arranged on the logic chip together with the count control unit and the estimation unit.

Furthermore, in the first aspect, the photodiode may be arranged on a light receiving chip, the count unit, the count control unit, and the estimation unit may be arranged on a logic chip stacked on the light receiving chip, and the clock unit may be arranged on a clock chip stacked on the logic chip. This brings about an effect that the time information is output by the clock unit stacked on the clock chip.

Furthermore, a second aspect of the present technology is an imaging device including a count unit configured to count a number of times a photon has been incident within a predetermined exposure period and output a count value, a count control unit configured to perform control to stop the count unit and perform a request of time information in a case where the count value has reached a predetermined value before the predetermined exposure period elapses, a clock unit configured to measure a time and output the time information in response to the request, an estimation unit configured to estimate a number of incident times of a photon within the predetermined exposure period on the basis of the output time information and output an estimation value, and a recording unit configured to record image data generated from the estimation value. This brings about an effect that the time information is output from the clock unit in response to the request and the estimation value is estimated from the time information.

Effects of the Invention

According to the present technology, in a solid-state image sensor that measures a time, an excellent effect that power consumption can be reduced can be exerted. Note that the effects described here are not necessarily limited, and any of effects described in the present disclosure may be exhibited.

BRIEF DESCRIPTION OF DRAWINGS

FIG. 9 is a diagram illustrating an example of an operation of a photon counter according to the first embodiment of the present technology.

FIG. 10 is a diagram illustrating an example of an operation of a count control unit according to the first embodiment of the present technology.

FIG. 11 is a diagram illustrating an example of an operation of a signal processing unit according to the first embodiment of the present technology.

FIG. 21 is a diagram illustrating an example of an operation of a count control unit according to a third embodiment of the present technology.

MODE FOR CARRYING OUT THE INVENTION

Hereinafter, modes for implementing the present technology (hereinafter referred to as embodiments) will be described. Description will be given according to the following order.

1. First embodiment (an example in which a clock unit outputs time information in response to a request)
2. Second embodiment (an example in which a clock unit continuously outputs time information in response to a request)
3. Third embodiment (an example in which a clock unit outputs time information in response to a request from an immediately preceding value to a limit value)
4. Fourth embodiment (an example in which a time information generation unit is shared by all of lines, and a clock unit outputs time information in response to a request)
5. Fifth embodiment (an example in which circuits are distributed and arranged on three chips, and a clock unit outputs time information in response to a request)
6. Application example to moving body 1. First Embodiment

[Configuration Example of Imaging Device]

Figure 1:
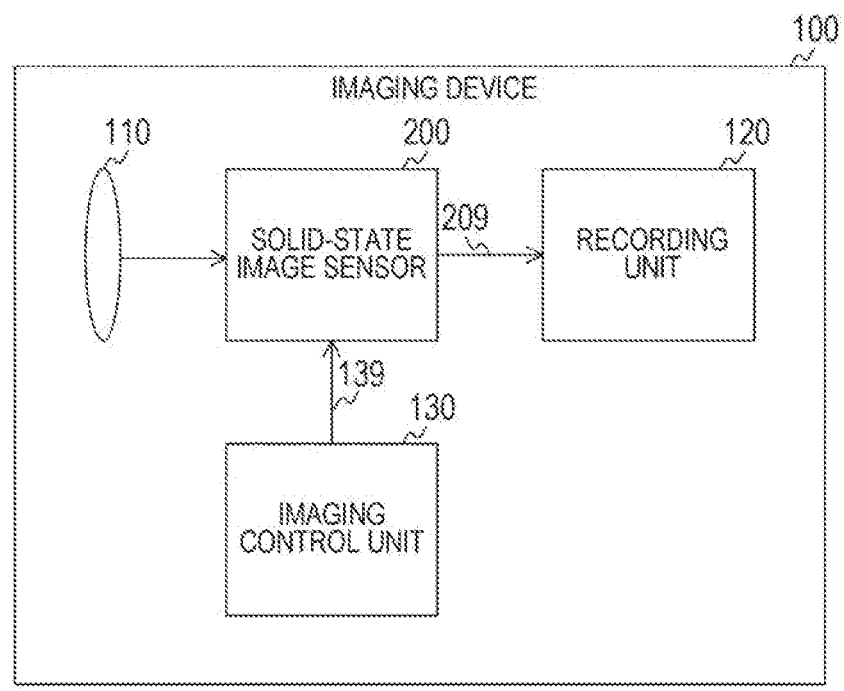
FIG. 1 is a block diagram illustrating a configuration example of an imaging device according to a first embodiment of the present technology.

FIG. 1 is a block diagram illustrating a configuration example of an imaging device 100 according to an embodiment of the present technology. The imaging device 100 images image data, and includes an imaging lens 110, a solid-state image sensor 200, a recording unit 120, and an imaging control unit 130. As the imaging device 100, for example, a smartphone, a digital camera, a personal computer, a vehicle-mounted camera, or an internet of things (IoT) camera is assumed.

The imaging lens 110 condenses incident light and guides the incident light to the solid-state image sensor 200. The solid-state image sensor 200 images image data under the control of the imaging control unit 130. The solid-state image sensor 200 supplies the imaged image data to the recording unit 120 via a signal line 209. The recording unit 120 records the image data.

The imaging control unit 130 causes the solid-state image sensor 200 to image image data. The imaging control unit 130 supplies, for example, a synchronization signal such as a vertical synchronization signal, an exposure control signal for controlling an exposure period, and an exposure time to the solid-state image sensor 200 via a signal line 139.

Note that the imaging device 100 may further include an interface and transmit image data to the outside through the interface, or may further include a display unit and display the image data on the display unit.

[Configuration Example of Solid-State Image Sensor]

Figure 2:
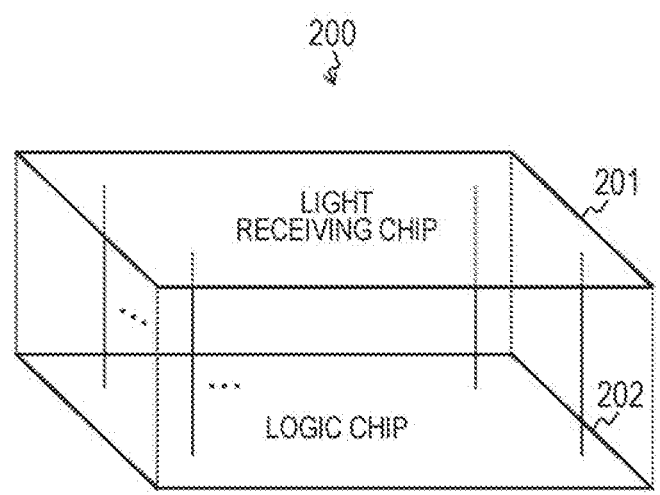
FIG. 2 is a diagram illustrating an example of a stacked structure of a solid-state image sensor according to the first embodiment of the present technology.

FIG. 2 is a diagram illustrating an example of a stacked structure of the solid-state image sensor 200 according to the embodiment of the present technology. The solid-state image sensor 200 includes a light receiving chip 201 and a logic chip 202 stacked on the light receiving chip 201. A signal line for transmitting a signal is provided between these chips.

[Configuration Example of Light Receiving Chip]

Figure 3:
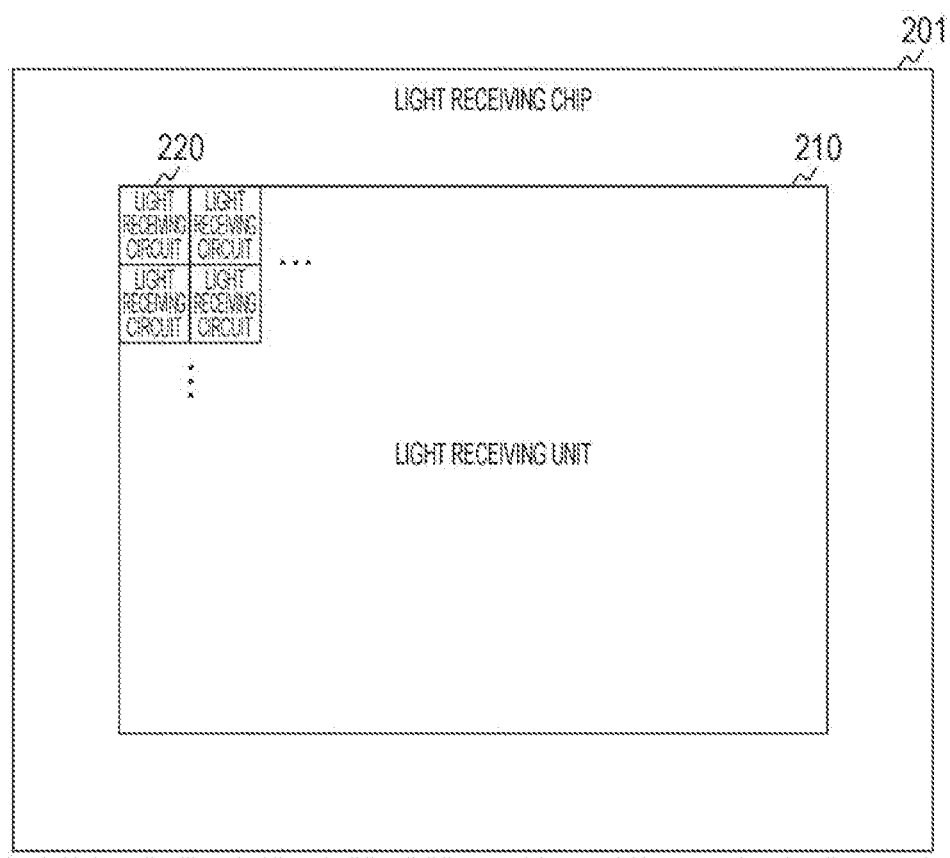
FIG. 3 is a plan view illustrating a configuration example of a light receiving chip according to the first embodiment of the present technology.

FIG. 3 is a plan view illustrating a configuration example of a light receiving chip 201 according to the embodiment of the present technology. The light receiving chip 201 is provided with a light receiving unit 210, and the light receiving unit 210 is provided with a plurality of light receiving circuits 220 in a two-dimensional lattice manner. Details of the light receiving circuit 220 will be described below.

[Configuration Example of Logic Chip]

Figure 4:
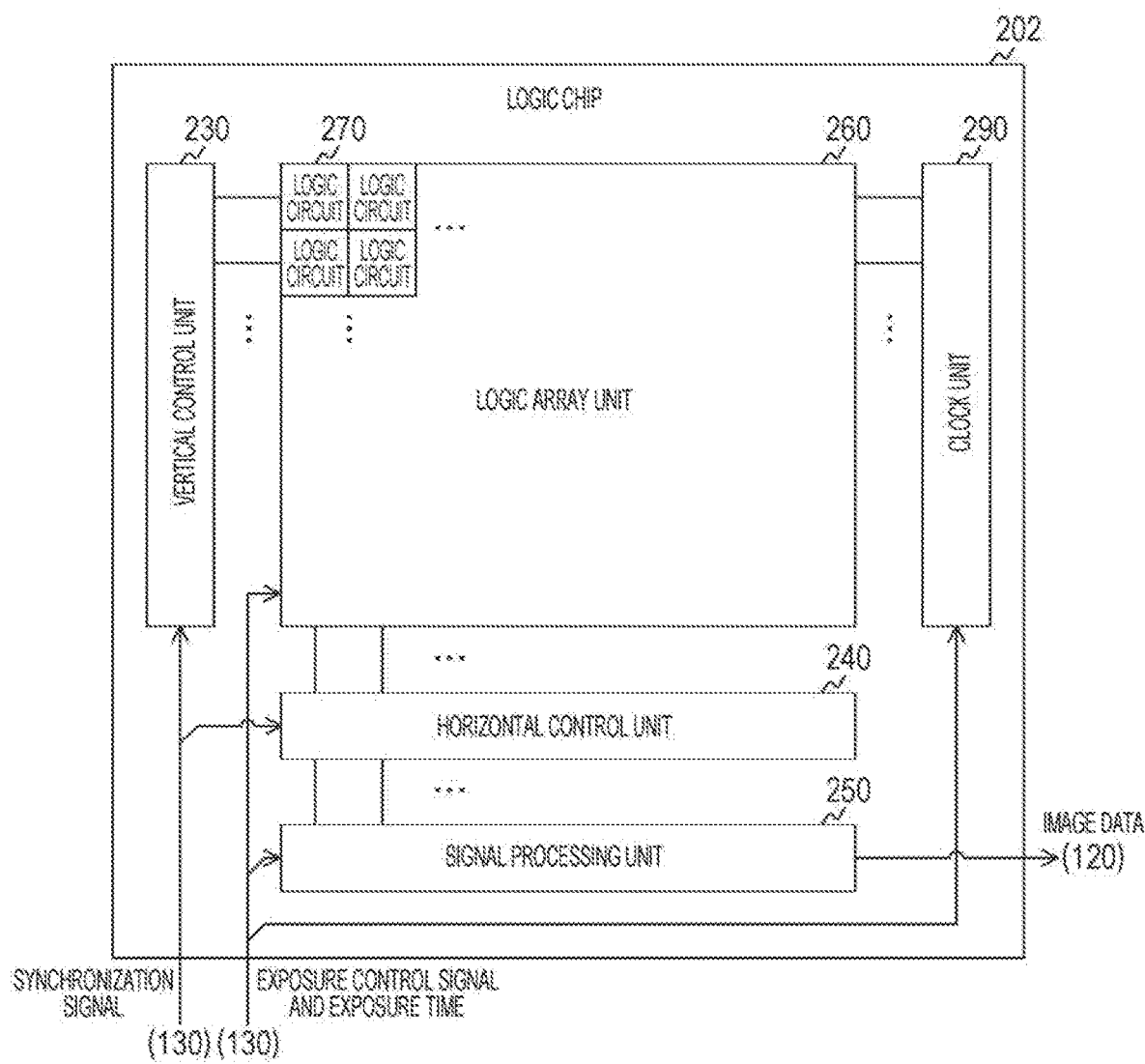
FIG. 4 is a block diagram illustrating a configuration example of a logic chip according to the first embodiment of the present technology.

FIG. 4 is a block diagram illustrating a configuration example of the logic chip 202 according to the embodiment of the present technology. On the logic chip 202, a vertical control unit 230, a logic array unit 260, a horizontal control unit 240, a signal processing unit 250, and a clock unit 290 are arranged. Furthermore, in the logic array unit 260, a logic circuit 270 is arranged for each light receiving circuit 220. Each of these logic circuits 270 is connected to the corresponding light receiving circuit 220 via a signal line. A circuit including the light receiving circuit 220 and the logic circuit 270 corresponding to the light receiving circuit 220 functions as a pixel circuit that generates a pixel signal of one pixel in image data.

Then, the vertical synchronization signal is input to the vertical control unit 230, and a horizontal synchronization signal is input to the horizontal control unit 240. An exposure control signal from an imaging control unit 130 is input to the logic array unit 260. The exposure control signal is input to the clock unit 290.

Hereinafter, a set of pixel circuits (the light receiving circuit 220 and the logic circuit 270) arrayed in a predetermined direction (such as a horizontal direction) is referred to as "row" or "line", and a set of pixel circuits arrayed in a direction perpendicular to the row is referred to as "column".

The vertical control unit 230 selects a row in order in synchronization with the vertical synchronization signal. The logic circuit 270 counts the number of times a photon is incident within an exposure period, and outputs a signal indicating a counted value to the signal processing unit 250 as a pixel signal. The horizontal control unit 240 selects a column in order in synchronization with the horizontal synchronization signal and outputs the pixel signal.

The signal processing unit 250 executes predetermined signal processing such as filtering processing to the image data including the pixel signals. The signal processing unit 250 outputs the processed image data to the recording unit 120. Furthermore, an exposure time from the imaging control unit 130 is input to the signal processing unit 250. Furthermore, the signal processing unit 250 estimates the number of incident times of a photon within the exposure period. Details of the estimation method will be described below.

The clock unit 290 measures a relative time within the exposure period according to the exposure control signal. The clock unit 290 outputs time information indicating the measured time to each of the logic circuits 270.

[Configuration Example of Clock Unit]

Figure 5:
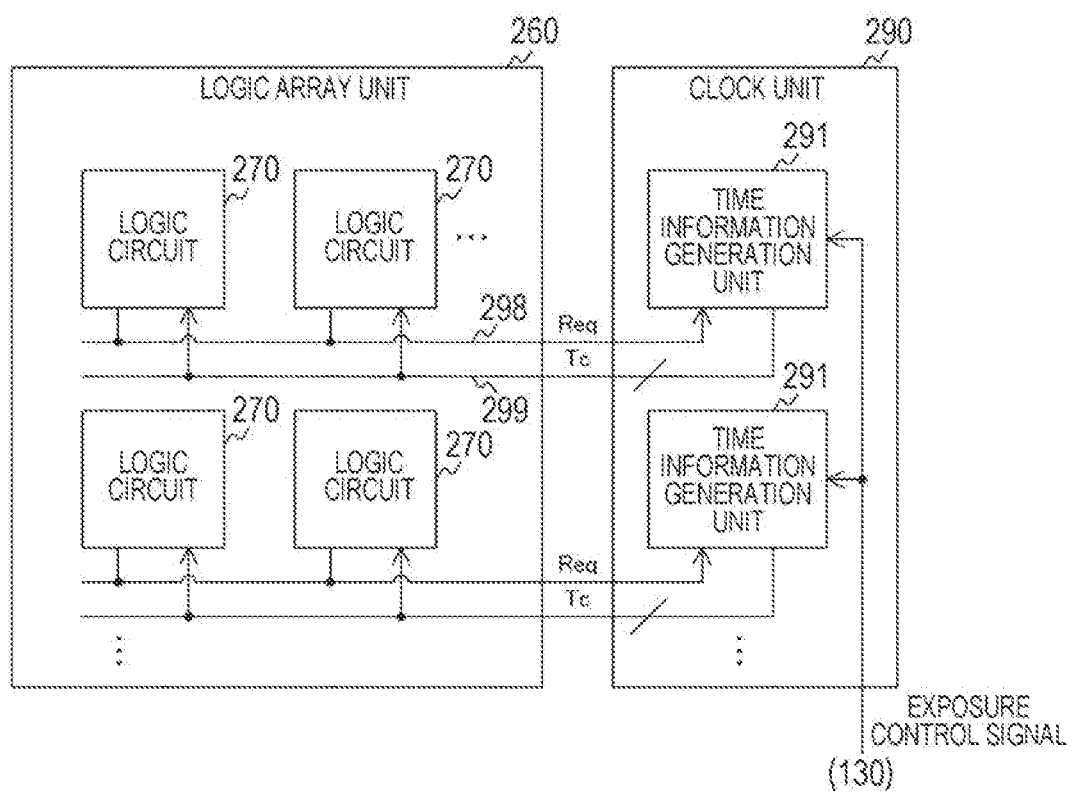
FIG. 5 is a block diagram illustrating a configuration example of a logic array unit and a clock unit according to the first embodiment of the present technology.

FIG. 5 is a block diagram illustrating a configuration example of the logic array unit 260 and the clock unit 290 according to the first embodiment of the present technology. In the logic array unit 260, the logic circuits 270 are arranged in a two-dimensional lattice manner. Then, horizontal signal lines 298 and 299 are wired for each row including the logic circuits 270 arrayed in the horizontal direction. Furthermore, in the clock unit 290, a time information generation unit 291 is arranged for each row. The time information generation unit 291 is connected to the logic circuits 270 (pixel circuits) of the corresponding row (in other words, the corresponding line) via the horizontal signal lines 298 and 299.

Assuming that the number of rows of the logic circuit 270 is N, N horizontal signal lines 298, N horizontal signal lines 299, and N time information generation units 291 are provided.

The logic circuit 270 generates a request Req requesting time information Tc at predetermined timing, and outputs the request Req to the time information generation unit 291 via the corresponding horizontal signal line 298.

The time information generation unit 291 measures the time and generates and outputs the time information Tc in response to the request Req. The time information generation unit 291 measures the relative time within the exposure period indicated by the exposure control signal. Then, when the request Req is input, the time information generation unit 291 generates information indicating the time at that time as the time information Tc, and outputs the time information Tc to each of the logic circuits 270 (pixel circuits) of the corresponding row via the horizontal signal line 299.

[Configuration Example of Time Information Generation Unit]

Figure 6:
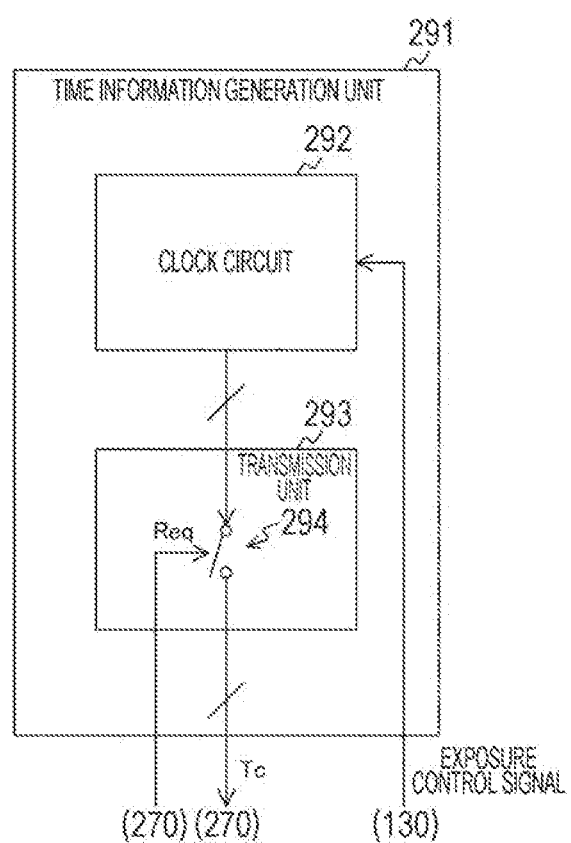
FIG. 6 is a block diagram illustrating a configuration example of a time information generation unit according to the first embodiment of the present technology.

FIG. 6 is a block diagram illustrating a configuration example of the time information generation unit 291 according to the first embodiment of the present technology. The time information generation unit 291 includes a clock circuit 292 and a transmission unit 293.

The clock circuit 292 measures the relative time within the exposure period indicated by the exposure control signal over the exposure period. The clock circuit 292 is configured by, for example, a counter. The clock circuit 292 supplies a timer value indicating the measured time to the transmission unit 293 every time measuring the time.

The transmission unit 293 outputs the time information in response to the request Req. The transmission unit 293 includes, for example, a switch 294. The switch 294 opens and closes a path between the clock circuit 292 and the corresponding logic circuit 270 according to the request Req. In a case where the request Req from the logic circuit 270 is not input, the switch 294 is in an open state and no time information is output. Meanwhile, in a case where the request Req is input, the switch 294 is transitioned to a close state, and outputs the information indicating the timer value of the clock circuit 292 to each of the corresponding logic circuits 270 as the time information Tc.

[Configuration Example of Pixel Circuit]

Figure 7:
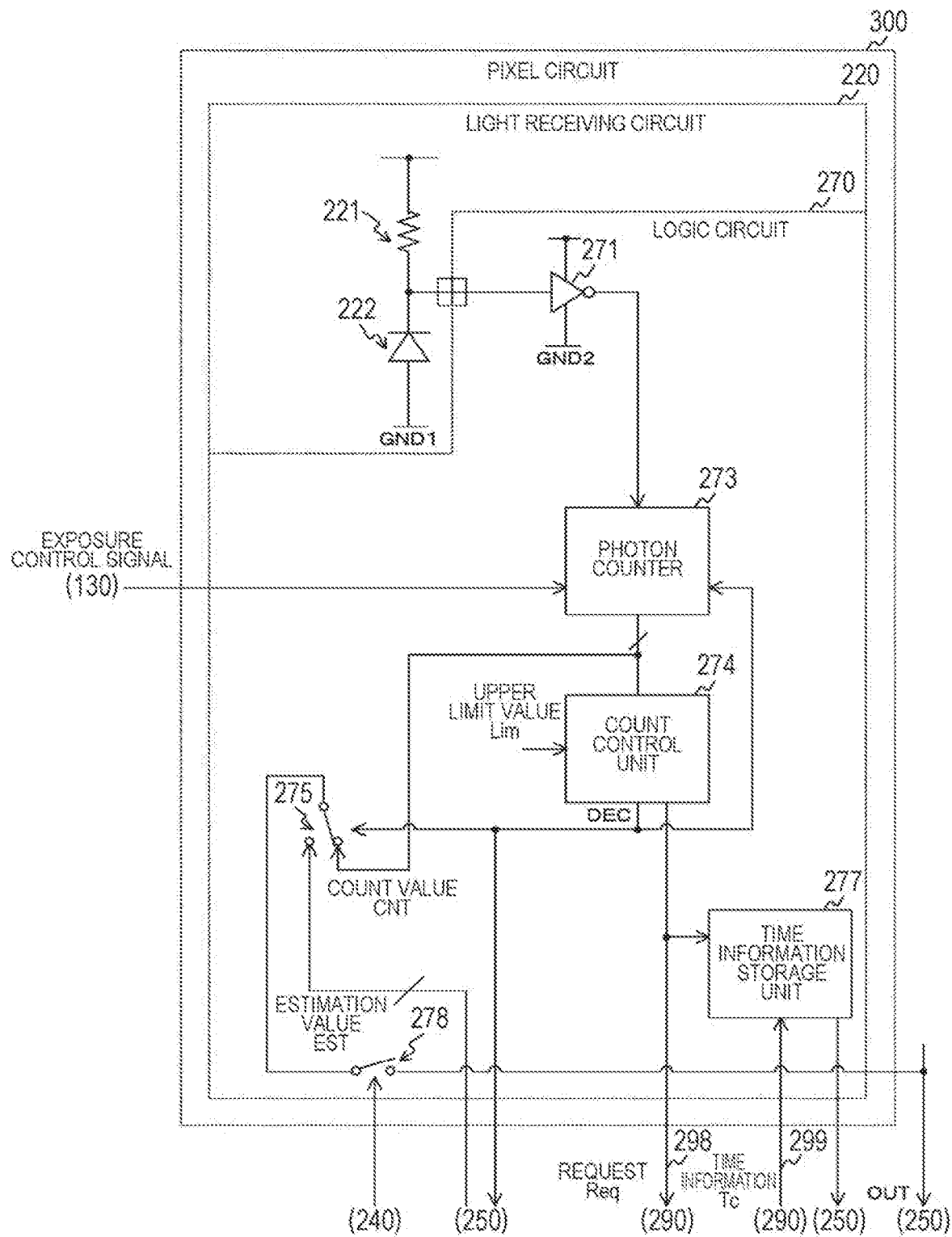
FIG. 7 is a circuit diagram illustrating a configuration example of a pixel circuit according to the first embodiment of the present technology.

FIG. 7 is a circuit diagram illustrating a configuration example of a pixel circuit 300 according to the first embodiment of the present technology. The pixel circuit 300 includes the light receiving circuit 220 and the logic circuit 270. The light receiving circuit 220 includes a resistor 221 and a photodiode 222. Furthermore, the logic circuit 270 includes an inverter 271, a photon counter 273, a count control unit 274, a switch 275, a time information storage unit 277, and a switch 278.

The photodiode 222 photoelectrically converts incident light and outputs a photocurrent. A cathode of the photodiode 222 is connected to a terminal of a power supply potential via the resistor 221, and an anode of the photodiode 222 is connected to a terminal (such as a ground terminal) of a potential GND1 lower than the power supply potential. As a result, a reverse bias is applied to the photodiode 222. Furthermore, the photocurrent flows in a direction from the cathode to the anode of the photodiode 222.

As the photodiode 222, for example, an avalanche photodiode capable of detecting the presence or absence of incidence of one photon by amplifying a photocurrent is used. Furthermore, use of an SPAD is particularly desirable among avalanche diodes.

One end of the resistor 221 is connected to a terminal of the power supply potential, and the other end of the resistor 221 is connected to the cathode of the photodiode 222. The photocurrent flows through the resistor 221 every time incidence of a photon is detected, and a cathode potential of the photodiode 222 drops to a value in an initial state, which is lower than the power supply potential.

The inverter 271 inverts a signal of a cathode potential of the photodiode 222 and outputs the inverted signal to the photon counter 273 as a pulse signal. The inverter 271 outputs a low-level pulse signal in a case where the cathode potential is higher than a predetermined value, and outputs a high-level pulse signal in a case where the cathode potential is equal to or lower than the predetermined value. Furthermore, a potential GND2 on the ground side to which the inverter 271 is connected is different from a potential GND2 in the light receiving circuit 220.

The photon counter 273 counts the number of times the high-level pulse signal has been output within the exposure period. This count value indicates the number of times the potential (cathode potential or the like) of one end of a photodiode 222 has varied due to detection of the presence or absence of incidence of photons. Assuming that a ratio of the number of pulses to an actual number of incident photons is 1/10, one count is performed every time 10 photons are incident.

The photon counter 273 sets a count value CNT to an initial value (for example, "0") at the start of exposure, and performs count over the exposure period. The count value is incremented, for example, every time a pulse signal is output. That is, an up-count is performed. Then, the photon counter 273 stops the count at the end of the exposure or under the control of the count control unit 274, and outputs the count value CNT to the count control unit 274 and the switch 275.

Note that the photon counter 273 is an example of a count unit described in the claims. Furthermore, the photon counter 273 performs up-count but may perform down-count instead of up-count.

The count control unit 274 performs control to stop the photon counter 273 and outputs the request Req requesting the time information Tc in a case where the count value CNT has reached a predetermined limit value. In the case of up-count, an upper limit value Lim is used as the limit value. The upper limit value Lim is a value equal to or less than the maximum value that can be counted by the photon counter 273, and is set in a register or the like in advance. For example, in a case where an 8-bit counter is used as the photon counter 273, a value equal to or less than "255" (such as "254" or "255") is set as the upper limit value Lim.

The count control unit 274 determines whether or not the count value CNT has reached the upper limit value Lim within the exposure period, and outputs a determination result DEC to the photon counter 273, the switch 275, and the signal processing unit 250. Furthermore, the count control unit 274 generates the request Req and outputs the request Req to the time information storage unit 277 and the clock unit 290 in a case where the count value CNT has reached the upper limit value Lim within the exposure period. Note that, in the case where down-count is performed, a lower limit value is used instead of the upper limit value.

When the request Req is generated, the time information storage unit 277 fetches and stores the time information Tc generated by the clock unit 290 in response to the request. A register or a memory is used as the time information storage unit 277.

Furthermore, in the case where the count value CNT has reached the predetermined limit value, the signal processing unit 250 estimates a count value indicating the number of incident times of a photon within the exposure period, and outputs the estimated count value as an estimation value EST. The signal processing unit 250 obtains the estimation value EST using an exposure time Te from the imaging control unit 130, the time information Tc stored in the time information storage unit 277, and the upper limit value Lim, according to the following expression. Then, the signal processing unit 250 outputs the estimation value EST to the switch 275. Note that the signal processing unit 250 is an example of an estimation unit described in the claims.

$$EST=Lim \times (Te/Tc) \quad \text{Expression 1}$$

The switch 275 selects one of the count value CNT and the estimation value EST according to the determination result DEC. This switch 275 selects the estimation value EST in a case where the count value CNT has reached the predetermined limit value and outputs the estimation value EST to the switch 278 as an output value OUT. On the other hand, in a case where the count value CNT has not reached the predetermined limit value, the switch 275 selects the count value CNT and supplies the count value CNT to the switch 278 as the output value OUT.

The switch 278 outputs a signal of the output value OUT to the signal processing unit 250 as a pixel signal under the control of the horizontal control unit 240.

Figure 8:
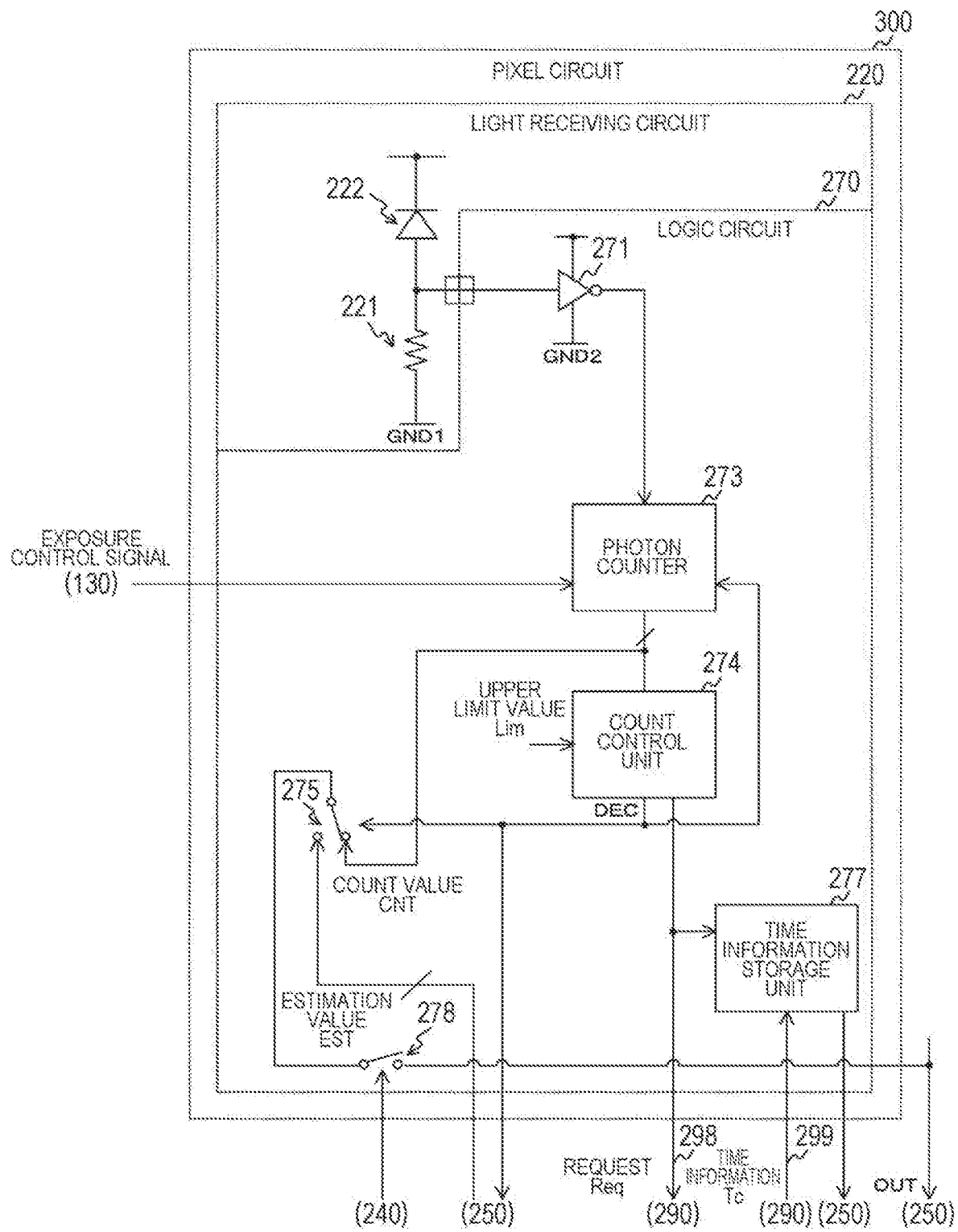
FIG. 8 is a circuit diagram illustrating a configuration example of a pixel circuit when an anode and a cathode are reversed according to the first embodiment of the present technology.

Note that, although the cathode of the photodiode 222 is connected to the resistor 221, the anode may be connected to the resistor 221 as illustrated in FIG. 8.

FIG. 9 is a diagram illustrating an example of an operation of a photon counter according to the first embodiment of the present technology. The exposure control signal and the determination result DEC are input to the photon counter 273. Here, for example, "1" is set to the exposure control signal within the exposure period, and "0" is set to the exposure control signal outside the exposure period. Furthermore, for example, "1" is set to the determination result DEC in a case where the count value CNT has reached the upper limit value Lim, and "0" is set to the determination result DEC in a case where the count value CNT is less than the upper limit value Lim.

In the case where the exposure control signal is "0" (that is, outside the exposure period), the photon counter 273 stops the count operation regardless of the value of the determination result DEC. Meanwhile, in the case where the exposure control signal is "1" (that is, within the exposure period), the photon counter 273 continuously performs the count operation when the determination result DEC is "0" (that is, the count value CNT is less than the upper limit value Lim). However, when the determination result DEC is "1" (that is, the count value CNT is the upper limit value Lim), the photon counter 273 stops the count operation.

FIG. 10 is a diagram illustrating an example of an operation of the count control unit 274 according to the first embodiment of the present technology. In the case where the count value CNT is less than the upper limit value Lim, the count control unit 274 outputs the determination result DEC of "0" to cause the photon counter 273 to continuously perform the count operation, and sets "0" as the request Req.

Meanwhile, in the case where the count value CNT is the upper limit value Lim, the count control unit 274 outputs the determination result DEC of "1" to cause the photon counter 273 to stop the count operation, and outputs the request Req of "1" to request the time information Tc.

FIG. 11 is a diagram illustrating an example of an operation of the signal processing unit 250 according to the first embodiment of the present technology. In the case where the determination result DEC is "0" (that is, the count value CNT is less than the upper limit value Lim), the signal processing unit 250 stops calculation of the estimation value without executing the calculation. Meanwhile, in the case where the determination result DEC is "1" (that is, the count value CNT is the upper limit value Lim), the signal processing unit 250 calculates the estimation value EST using the expression 1.

Figure 12:
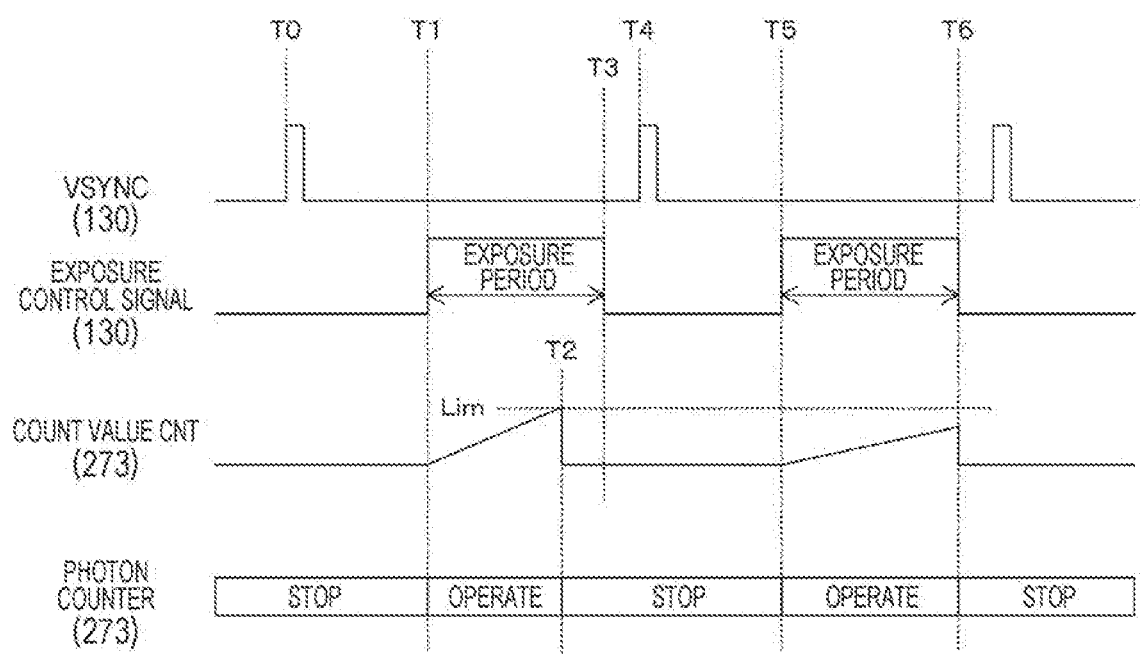
FIG. 12 is a timing chart illustrating an example of an operation of the imaging device according to the first embodiment of the present technology.

FIG. 12 is a timing chart illustrating an example of an operation of the imaging device 100 according to the first embodiment of the present technology. The period from rising timing T0 of a vertical synchronization signal VSYNC to next rising timing T4 corresponds to a cycle of the vertical synchronization signal VSYNC. The exposure period is set within this cycle.

For example, the imaging control unit 130 sets a period from the timing T1 to timing T3 in the cycle as the exposure period, and sets the exposure control signal to a high level over the exposure period. Then, the photon counter 273 operates and counts the count value CNT within the exposure period. Then, when the count value CNT has reached the upper limit value Lim at timing T2 within the exposure period, the count control unit 274 causes the photon counter 273 to stop the count. The photon counter 273 sets the count value to an initial value at the stop of the operation.

Furthermore, after the next rising timing T4 of the vertical synchronization signal VSYNC, the imaging control unit 130 sets a period from timing T5 to timing T6 in the cycle as the exposure period. The photon counter 273 operates and counts the count value CNT within the exposure period. Since the count value CNT has not reached the upper limit value Lim during this exposure period, the photon counter 273 stops the count operation at the end of the exposure period.

As described above, the photon counter 273 stops the count when the count value CNT reaches the upper limit value Lim during the exposure period. Here, in general, the power consumption of the counter becomes larger as the number of count times increases. Therefore, the photon counter 273 stops the count in the middle of the exposure period, thereby reducing the power consumption, as compared with a case of continuing the count without stopping. However, in the case of stopping the count in the middle of the exposure period, the count value CNT (that is, the upper limit value Lim) at that time is different from a value of the case of counting the count value CNT until the end of the exposure period without stopping, and is no longer the value according to an exposure amount during the exposure period. Therefore, the signal processing unit 250 estimates the count value at the end of the exposure period.

Figure 13:
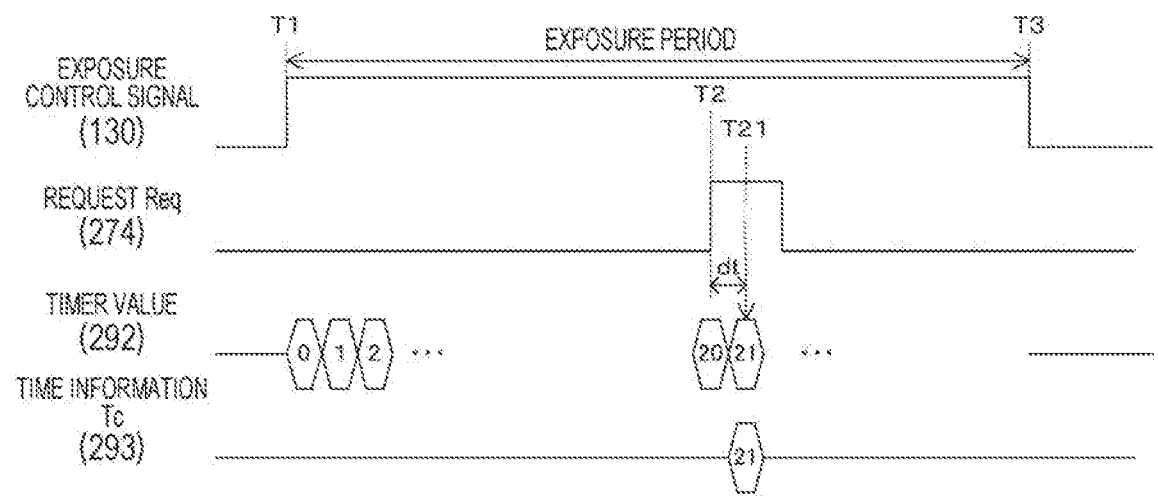
FIG. 13 is a timing chart illustrating an example of operations of the pixel circuit and the clock unit according to the first embodiment of the present technology.

FIG. 13 is a timing chart illustrating an example of operations of the pixel circuit 300 and the clock unit 290 according to the first embodiment of the present technology. The clock circuit 292 in the clock unit 290 measures the time and updates the timer value indicating the time in synchronization with a clock signal or the like over the exposure period from the timing T1 to T3.

When the count value CNT has reached the upper limit value Lim at the timing T2 in the exposure period, the count control unit 274 in the pixel circuit 300 outputs the high-level request Req over a predetermined pulse period.

Then, when the request Req is input, the transmission unit 293 in the clock unit 290 outputs the time information Tc at timing T21 at which a delay time dt has elapsed from the timing T2. Here, the delay time dt is caused by a transmission delay in which the request Req is transmitted from the pixel circuit 300 to the clock unit 290 via the horizontal signal line 298 or an operation time of a circuit in the transmission unit 293.

As described above, the clock unit 290 outputs the time information Tc only when the request Req is input. Therefore, the number of transmissions of the time information Tc is reduced and the power consumption of the clock unit 290 can be reduced, as compared with a case of continuing the output of the time information Tc over the exposure period.

Figure 14:
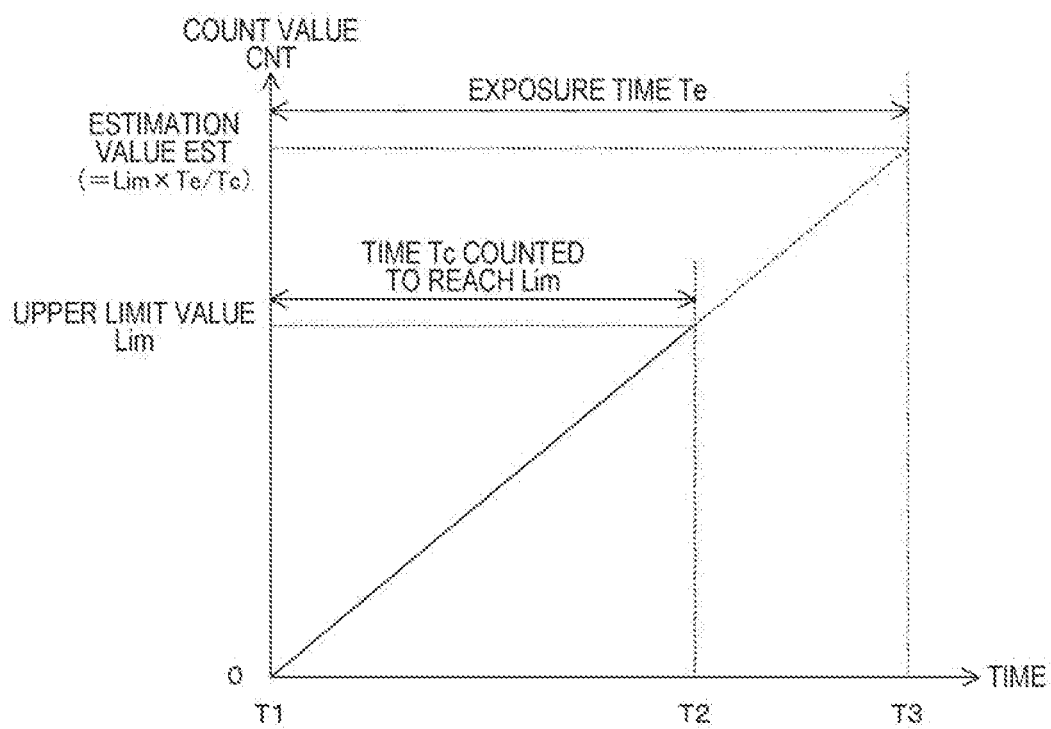
FIG. 14 is a diagram illustrating an example of variation in a count value according to the first embodiment of the present technology.
Figure 20:
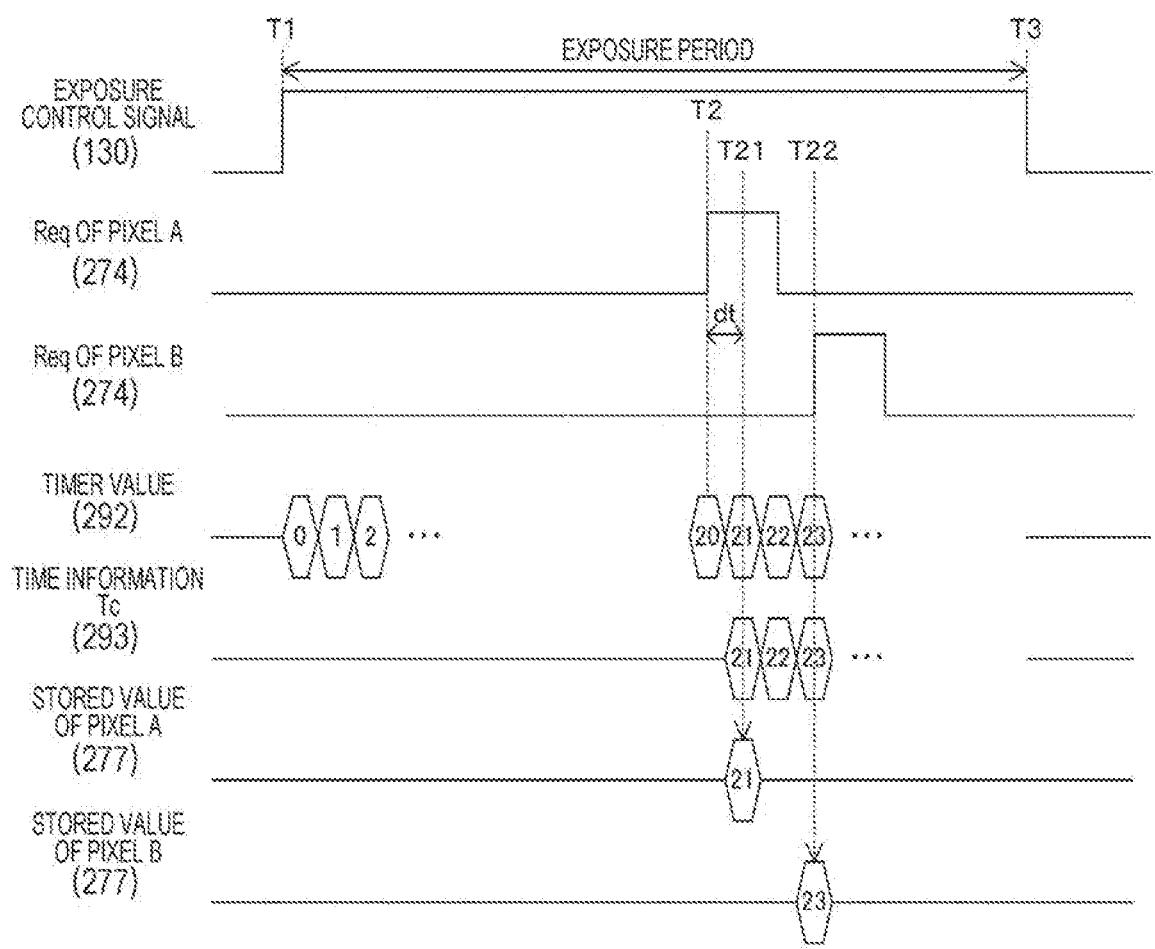
FIG. 20 is a timing chart illustrating an example of operations of the pixel circuit and the clock unit according to the second embodiment of the present technology.

FIG. 14 is a diagram illustrating an example of variation in the count value according to the first embodiment of the present technology. In FIG. 20, the vertical axis represents the count value CNT, and the horizontal axis represents a counting time. The timing T1 is an exposure start time, and the timing T3 is an exposure end time. The time from the timing T1 to T3 corresponds to the exposure time Te.

At the timing T1, the photon counter 273 starts count, and the count value CNT increases with time. An increasing speed of the count value CNT becomes substantially constant in a case where there is almost no change in illuminance during the exposure period, and the increasing speed becomes faster as the illuminance is higher. Then, it is assumed that the count value CNT has reached the upper limit value Lim at the timing T2. At this timing T2, the photon counter 273 stops the count.

Then, the signal processing unit 250 substitutes a time Tc from the timing T1 to T2, the exposure time Te, and the upper limit value Lim into the expression 1, and calculates the count value at the end of the exposure as the estimation value EST. The above-described time information may be information indicating the time (timing T2 or the like) at which the request has been input or may be information indicating the time (Tc or the like) from the start of the exposure to when the request is input.

In a case where the maximum value that can be counted by the photon counter 273 is the upper limit value Lim, the solid-state image sensor 200 can estimate the count value according to the exposure amount even in a case of receiving light of an amount exceeding a light amount corresponding to the upper limit value Lim.

Meanwhile, assuming a comparative example in which the count is not stopped during the exposure period, there is a possibility that an accurate count value may not be able to be obtained if the exposure amount is large in the comparative example. For example, in a case of using an 8-bit counter, when light of an amount exceeding a light amount corresponding to "255", the count value overflows and becomes an inaccurate value in the comparative example. To avoid the overflow, a counter having a sufficiently large number of digits may be used. However, the power consumption, circuit scale, and cost of the counter increase as the number of digits becomes larger, which is not desirable.

Meanwhile, in the solid-state image sensor 200, the signal processing unit 250 estimates the count value at the end of the exposure using the expression 1. Therefore, a dynamic range can be expanded. Furthermore, since use of the counter having a large number of digits is not necessary, the power consumption and the like can be reduced.

Furthermore, the power consumption can be reduced by making the upper limit value Lim smaller. However, an error in the estimation value EST becomes larger instead. The value of the upper limit value Lim is determined in consideration of the advantage of the reduction of the power consumption and the disadvantage of the decrease in the accuracy of the estimation value EST.

Figure 15:
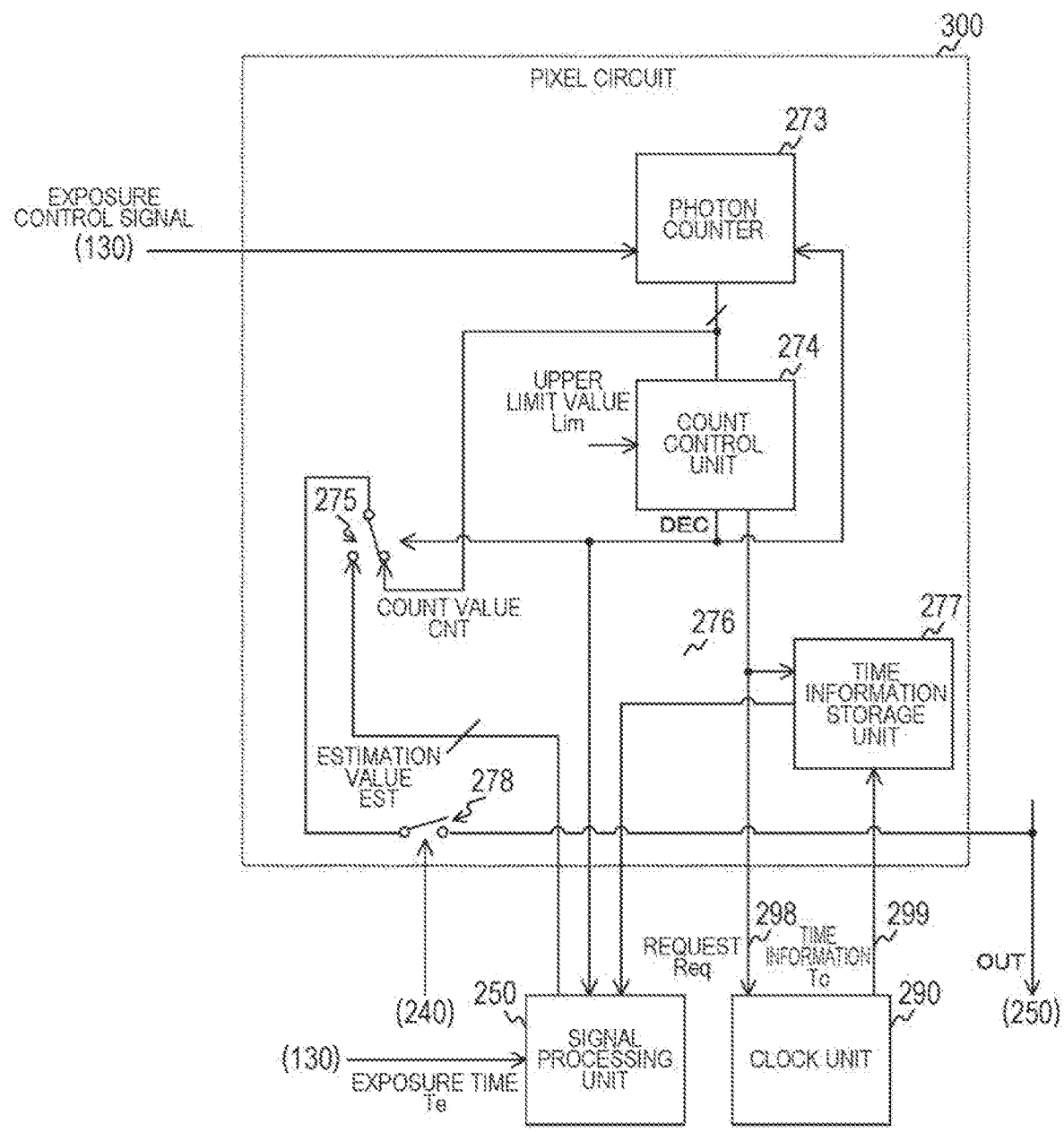
FIG. 15 is a simplified diagram of the pixel circuit and the clock unit according to the first embodiment of the present technology.

FIG. 15 is a simplified diagram of the pixel circuit 300 and the clock unit 290 according to the first embodiment of the present technology.

The photon counter 273 counts the number of times a photon has been incident within the exposure period and outputs the measured number of times as the count value CNT. In a case where the count value CNT has reached the upper limit value Lim before the exposure period elapses, the count control unit 274 stops the photon counter 273 according to the determination result DEC, and outputs the request Req requesting the time information Tc.

Then, the clock unit 290 outputs the time information Tc in response to the request Req. The time information storage unit 277 fetches and stores the time information Tc, and the signal processing unit 250 obtains the estimation value EST from the time information Tc and the like, using the expression 1.

[Operation Example of Pixel Circuit]

Figure 16:
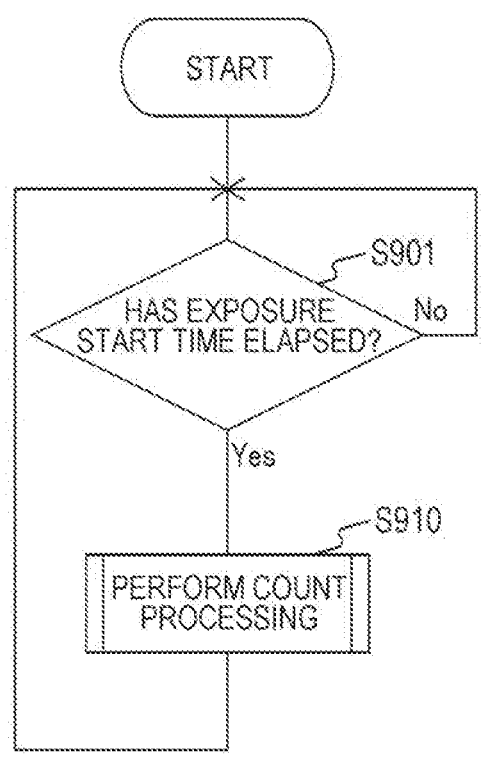
FIG. 16 is a flowchart illustrating an example of an operation of the imaging device according to the first embodiment of the present technology.

FIG. 16 is a flowchart illustrating an example of an operation of the pixel circuit 300 according to the first embodiment of the present technology. This operation is started when, for example, a predetermined application for imaging image data is executed.

The pixel circuit 300 determines whether or not the exposure start time has elapsed (step S901).

In a case where the exposure start time has elapsed (step S901: Yes), the pixel circuit 300 performs count processing of counting the count value CNT (that is, photon count) (step S910). In a case where the time is before the exposure start time (step S901: No) or after step S910, the pixel circuit 300 repeats step S901 and subsequent steps.

Figure 17:
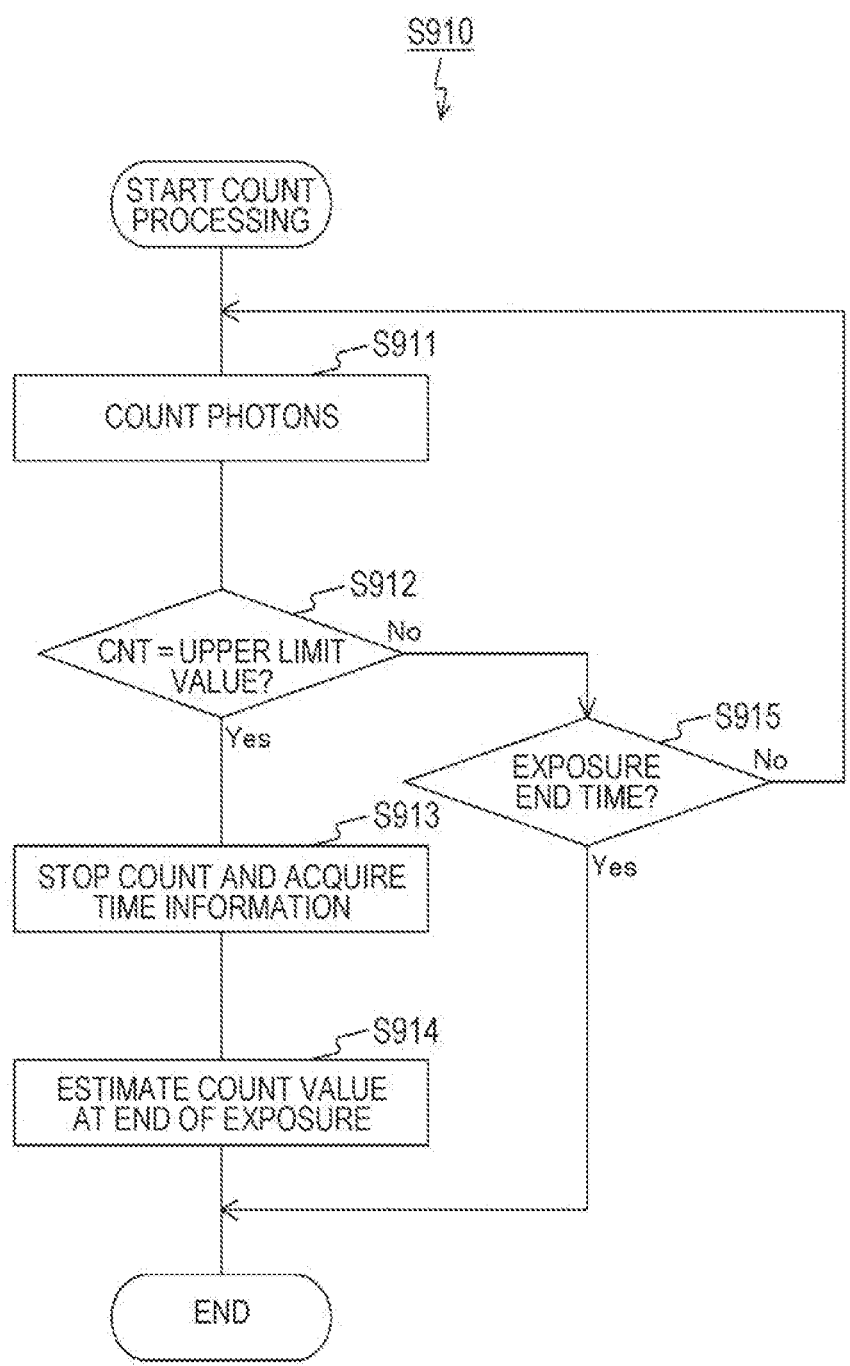
FIG. 17 is a flowchart illustrating an example of count processing according to the first embodiment of the present technology.

FIG. 17 is a flowchart illustrating an example of count processing according to the first embodiment of the present technology. The photon counter 273 in the pixel circuit 300 counts the number of photons (step S911), and the count control unit 274 determines whether or not the count value CNT has reached the upper limit value Lim (step S912).

In the case where the count value CNT has reached the upper limit value Lim (step S912: Yes), the photon counter 273 stops the count and the count control unit 274 acquires the time information according to the request Req (step S913). Furthermore, the signal processing unit 250 estimates the count value at the end of the exposure (step S914).

On the other hand, in the case where the count value CNT is less than the upper limit value Lim (step S912: No), the photon counter 273 determines whether or not the time is the exposure end time (step S915). In the case where the time is before the exposure end time (step S915: No), the photon counter 273 repeatedly executes step S911 and subsequent steps.

In the case where the time is the exposure end time (step S915: Yes) or after step S914, the pixel circuit 300 terminates the count processing.

As described above, according to the first embodiment of the present technology, the clock unit 290 outputs the time information in response to the request from the pixel circuit 300. Therefore, the power consumption of the clock unit 290 can be reduced, as compared with the case of continuously outputting the time information over the exposure period.

[Modification]

In the above-described first embodiment, the resistor 221 and the photodiode 222 are arranged for each pixel in the light receiving chip 201. However, there is a problem that the circuit scale of the light receiving chip 201 becomes larger as the number of pixels increases. The solid-state image sensor 200 according to a modification of the first embodiment is different from that of the first embodiment in that only the photodiode 222 is arranged in the light receiving chip 201.

Figure 18:
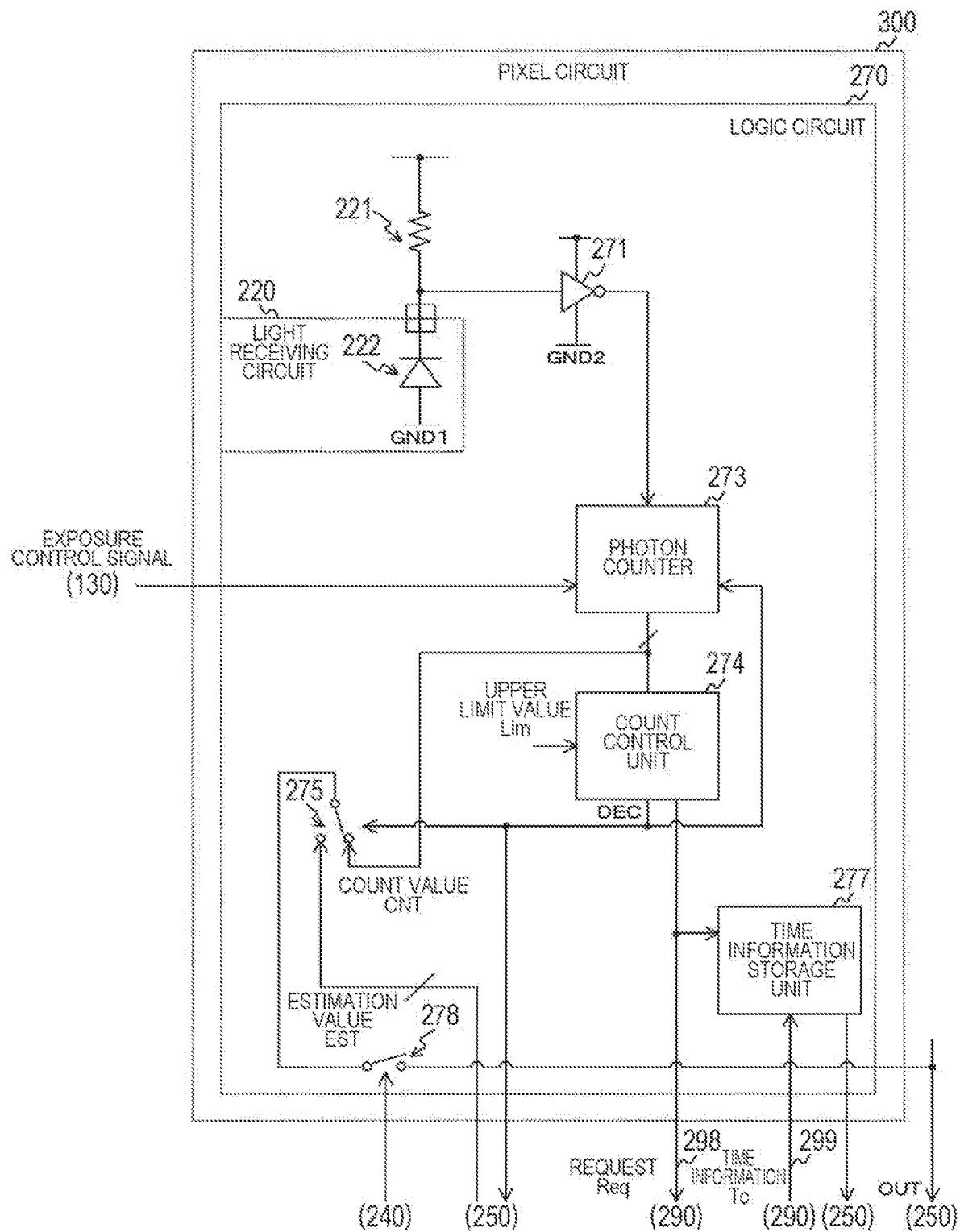
FIG. 18 is a circuit diagram illustrating a configuration example of a pixel circuit according to a modification of the first embodiment of the present technology.

FIG. 18 is a circuit diagram illustrating a configuration example of a pixel circuit 300 according to a modification of the first embodiment of the present technology. The pixel circuit 300 according to the modification of the first embodiment is different from that of the first embodiment in that only the photodiode 222 is arranged in the light receiving circuit 220 on the light receiving chip 201 side. The circuits and elements other than the photodiode 222 are arranged on the logic chip 202 side.

As described above, according to the modification of the first embodiment of the present technology, since only the photodiode 222 is arranged on the light receiving chip 201, the circuit scale of the light receiving chip 201 can be reduced as compared with the case where both the resistor 221 and the photodiode 222 are arranged in the light receiving chip 201.

2. Second Embodiment

In the above-described first embodiment, a gap occurs between the time of the output of the request Req and the time stored by the pixel circuit 300 due to the transmission delay of the request Req and the like. A clock unit 290 according to a second embodiment is different from that of the first embodiment in continuously outputting time information Tc from the time of output of a first request Req to the end of exposure to suppress a delay.

Figure 19:
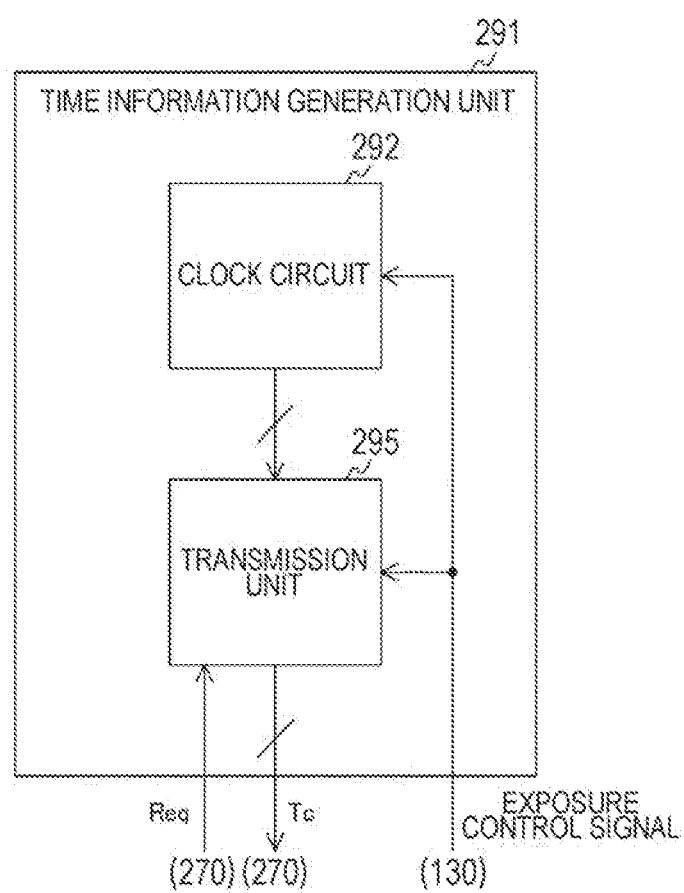
FIG. 19 is a block diagram illustrating a configuration example of a time information generation unit according to a second embodiment of the present technology.

FIG. 19 is a block diagram illustrating a configuration example of a time information generation unit 291 according to the second embodiment of the present technology. The time information generation unit 291 of the second embodiment is different from that of the first embodiment in including a transmission unit 295 instead of the transmission unit 293. An exposure control signal in addition to the request Req is input to the transmission unit 295.

When the request is input from any of pixels in a row within an exposure period, the transmission unit 295 starts output of time information Tc and continues the output until the end of exposure.

FIG. 20 is a timing chart illustrating an example of operations of a pixel circuit 300 and the clock unit 290 according to the second embodiment of the present technology. It is assumed that a pixel A outputs a request Req at timing T2 in the exposure period in a certain row. The transmission unit 293 in that row starts output of the time information Tc at timing T21 when a delay time dt has elapsed. The pixel A fetches and stores the time information Tc of the timing T21. Then, the clock unit 290 outputs the time information Tc of each time from the timing T21 to timing T3 at the end of exposure.

Next, it is assumed that, at timing T22 after the timing T21, a pixel B in the same row as the pixel A outputs the request Req. The pixel B fetches and stores the time information Tc of the timing T22.

The time stored by the pixel A that has first output the request Req is delayed by the delay time dt from the time of the output of the request Req. However, thereafter, the time information is continuously output regardless of the presence or absence of the request Req. Therefore, the time stored by the pixel B that has output the request Req is not much delayed from the time of the output of the request Req.

As described above, according to the second embodiment of the present technology, the clock unit 290 continuously outputs the time information from an input of the request from any of pixels. Therefore, the gap between the time of the request output by a pixel thereafter, and the time stored in the pixel can be suppressed.

3. Third Embodiment

In the above-described first embodiment, a gap occurs between the time of the output of the request Req (that is, the time when the count value has reached the upper limit value) and the time stored by the pixel circuit 300 due to the transmission delay of the request Req and the like. A pixel circuit 300 according to a third embodiment is different from that of the first embodiment in starting output of time information before a count value CNT reaching an upper limit value Lim to suppress a gap of times.

FIG. 21 is a diagram illustrating an example of an operation of a count control unit 274 according to the third embodiment of the present technology. In the count control unit 274 according to the third embodiment, an immediately preceding value Pre is further set in addition to an upper limit value Lim. The immediately preceding value Pre is a value indicating a count value CNT before reaching the upper limit value Lim. For example, in a case of performing up-count, a value smaller than the upper limit value Lim is set as the immediately preceding value Pre. Specifically, when the upper limit value Lim is "255", "250" or the like is set as the immediately preceding value Pre. Note that, in a case of performing down-count, a value larger than the lower limit value is set as the immediately preceding value Pre.

In a case where the count value CNT is less than the immediately preceding value Pre, the count control unit 274 outputs a determination result DEC of "0" and a request Req of "0". Furthermore, in a case where the count value CNT is equal or larger than the immediately preceding value Pre and less than the upper limit value Lim, the count control unit 274 outputs the determination result DEC of "0" and the request Req of "1". Then, in a case where the count value CNT has reached the upper limit value Lim, the count control unit 274 outputs the determination result DEC of "1" and the request Req of "0".

Figure 22:
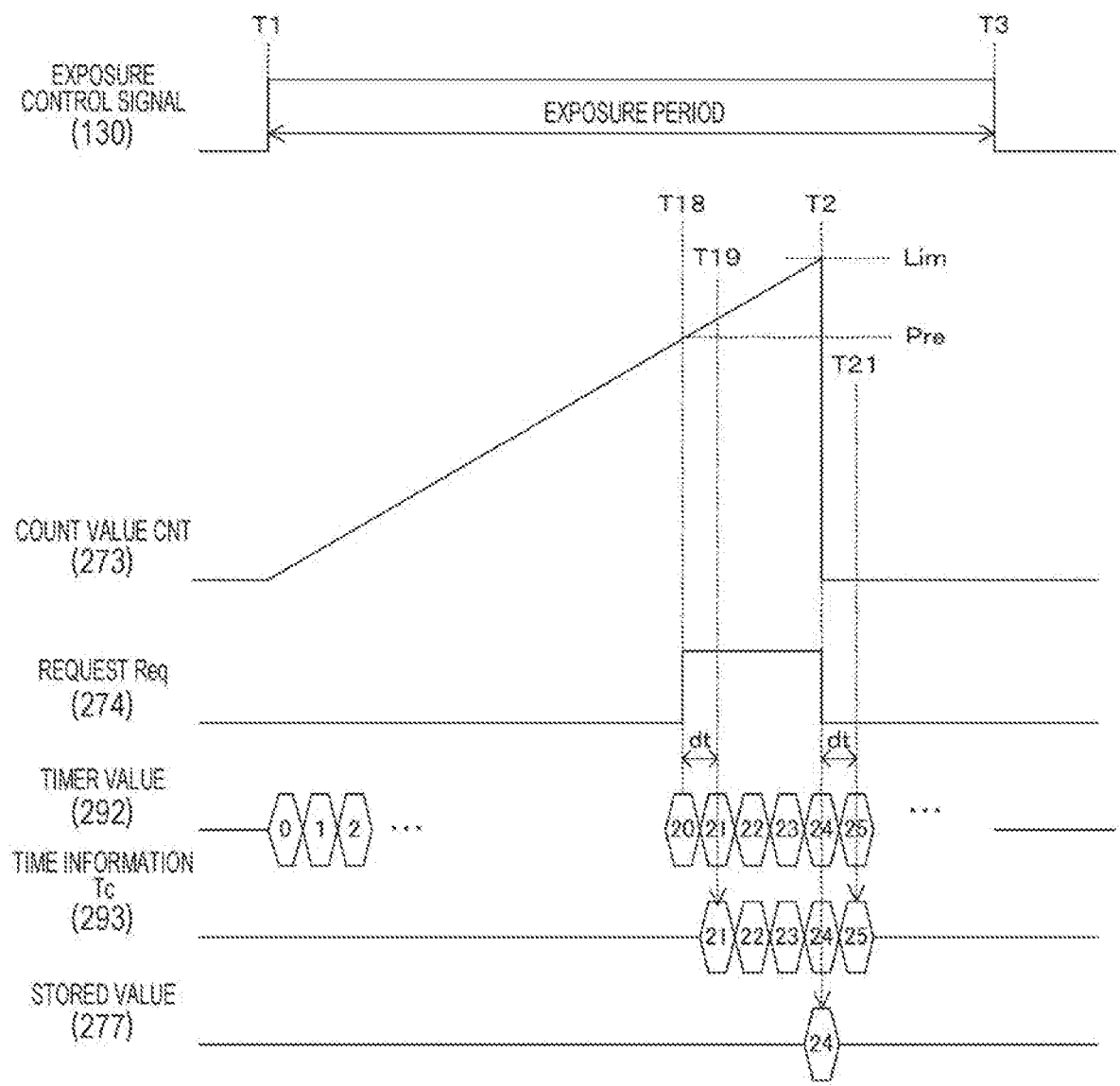
FIG. 22 is a timing chart illustrating an example of operations of the pixel circuit and the clock unit according to the third embodiment of the present technology.

FIG. 22 is a timing chart illustrating an example of operations of the pixel circuit 300 and a clock unit 290 according to the third embodiment of the present technology. When the count value CNT has reached the immediately preceding value Pre at timing T18 within an exposure period, the count control unit 274 outputs a high-level request Req. Then, when the count value CNT has reached the upper limit value Lim at timing T2, the count control unit 274 sets the request Req to a low level and stops the output. That is, the request Req is continuously output from the timing T18 to the timing T2.

A transmission unit 293 in the clock unit 290 starts output of the time information at timing T19 after a delay time dt has elapsed from the timing T18. Then, the transmission unit 293 stops the output of the time information at timing T21 after the delay time dt has elapsed from the timing T2. That is, the time information is output for each time within the period in which the request Req is input to the clock unit 290.

Furthermore, a time information storage unit 277 stores the time information at the timing T2 when the request Req has fallen. The time information is continuously output from the timing T19 before the timing T2 to the timing T21 after the timing T2. Therefore, the time stored by the time information storage unit 277 is not much delayed from the time when the count value CNT has reached the upper limit value Lim.

As described above, according to the third embodiment of the present technology, the count control unit 274 continuously outputs the requests from when the count value has reached the immediately preceding value to when the count value has reached the upper limit value. Therefore, the clock unit 290 can continuously output the time information during the period. Thus, the time information storage unit 277 can fetch and store the time at which the count value has reached the upper limit value during the output of the time information. Therefore, the gap between the time stored by the time information storage unit 277 and the time when the count value has reached the upper limit value can be suppressed.

4. Fourth Embodiment

In the above-described first embodiment, the time information generation unit 291 has been arranged for each row in the clock unit 290. However, the number of the time information generation units 291 becomes larger as the number of rows becomes larger, and the circuit scale and the cost may increase. A solid-state image sensor 200 according to a fourth embodiment is different from that of the first embodiment in that all of rows share one time information generation unit 291.

Figure 23:
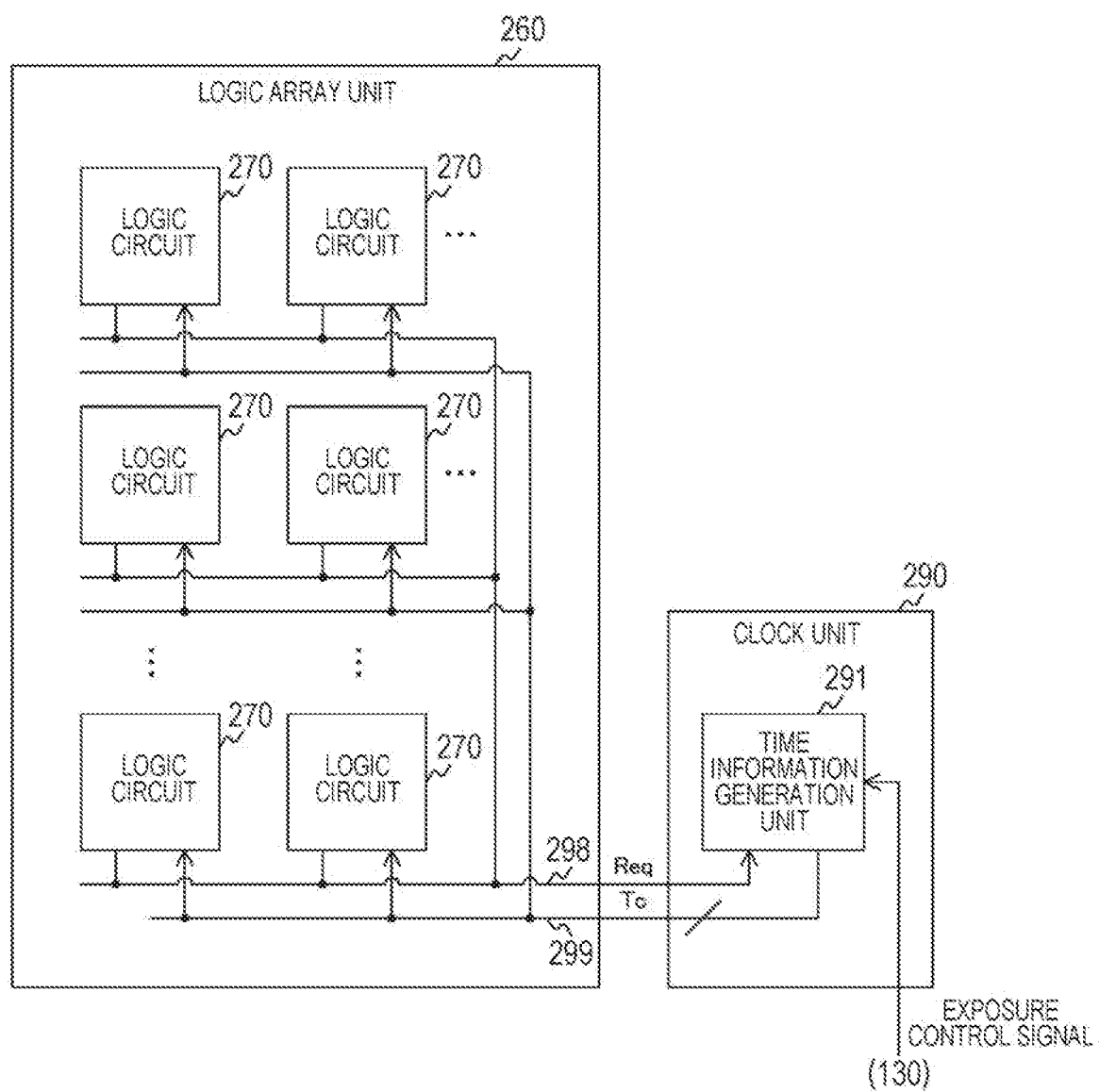
FIG. 23 is a block diagram illustrating a configuration example of a logic array unit and a clock unit according to a fourth embodiment of the present technology.

FIG. 23 is a block diagram illustrating a configuration example of a logic array unit 260 and a clock unit 290 according to the fourth embodiment of the present technology. The clock unit 290 according to the fourth embodiment is different from that of the first embodiment in holding only one time information generation unit 291. The time information generation unit 291 is connected to and shared by all the rows (that is, all the pixels).

As described above, according to the fourth embodiment of the present technology, all the rows share the one time information generation unit 291. Therefore, the circuit scale and cost of the clock unit 290 can be reduced as compared with the case of arranging the time information generation unit 291 for each row.

5. Fifth Embodiment

In the above-described first embodiment, in the solid-state image sensor 200, the circuits and elements are distributed and arranged on the two chips (the light receiving chip 201 and the logic chip 202). However, the circuit scales and costs of the chips may increase as the number of pixels becomes large. A solid-state image sensor 200 according to a fifth embodiment is different from that of the first embodiment in that circuits and the like are distributed and arranged on three chips.

Figure 24:
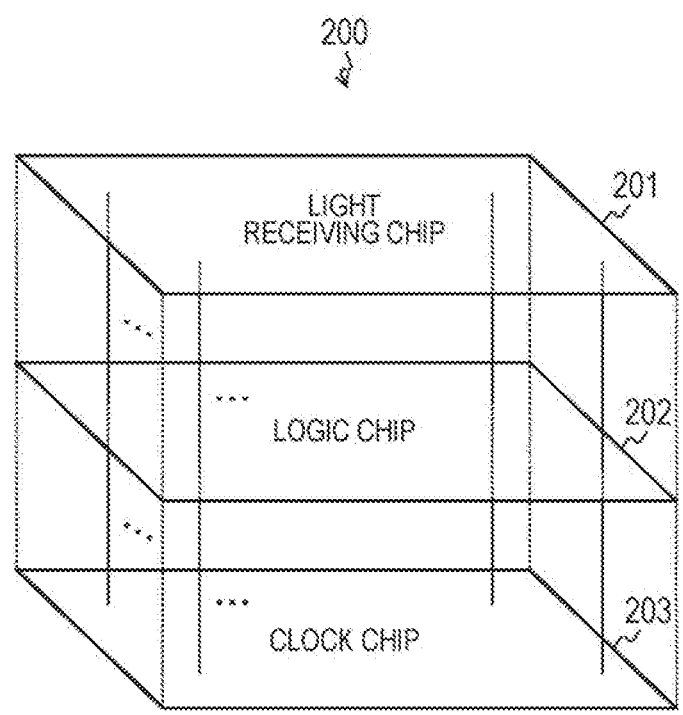
FIG. 24 is a diagram illustrating an example of a stacked structure of a solid-state image sensor according to a fifth embodiment of the present technology.

FIG. 24 is a diagram illustrating an example of a stacked structure of the solid-state image sensor 200 according to the fifth embodiment of the present technology. The solid-state image sensor 200 according to the fifth embodiment is different from that of the first embodiment in further including a clock chip 203 stacked on a logic chip 202.

Figure 25:
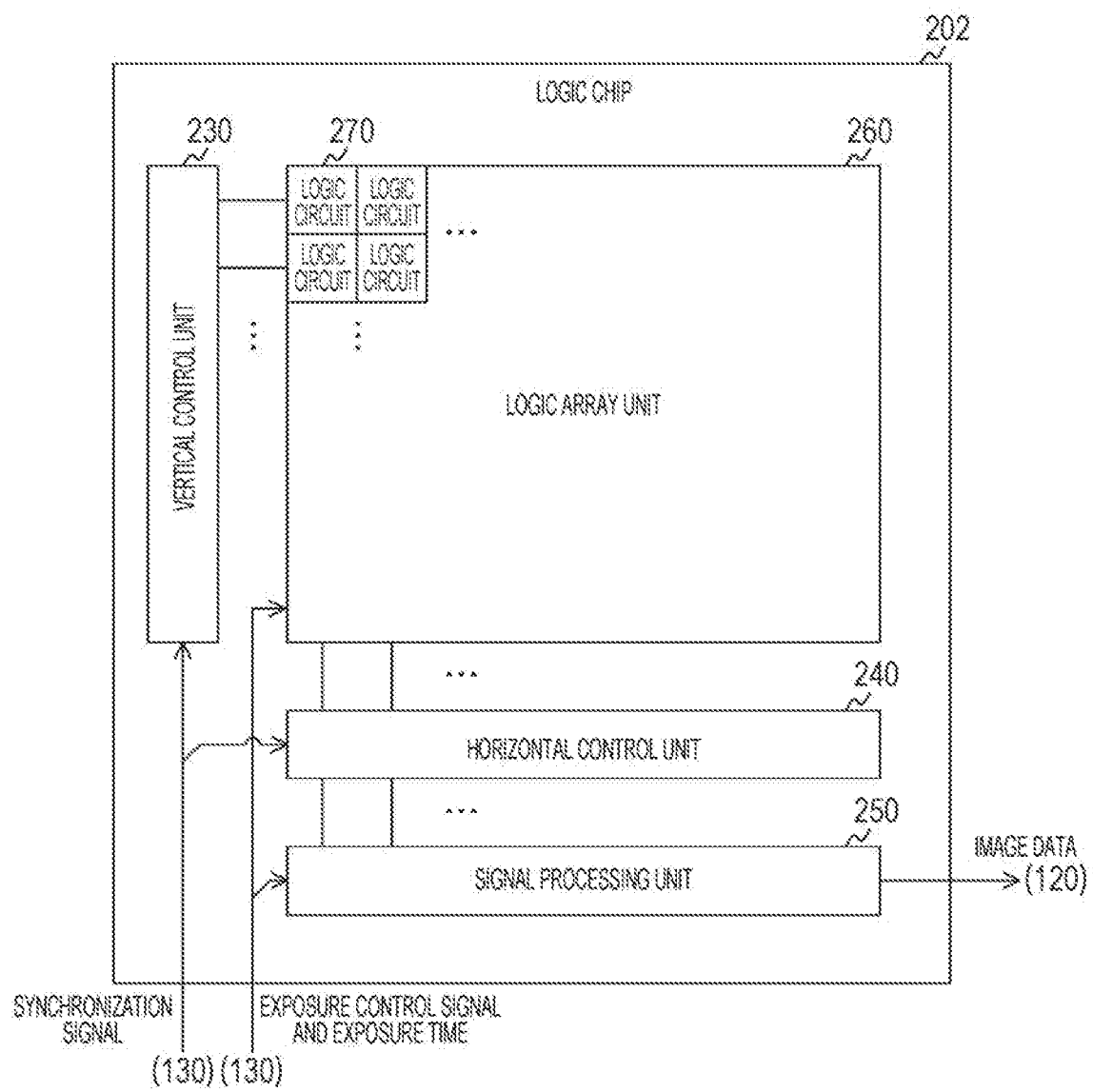
FIG. 25 is a block diagram illustrating a configuration example of a logic chip according to the fifth embodiment of the present technology.

FIG. 25 is a block diagram illustrating a configuration example of the logic chip 202 according to the fifth embodiment of the present technology. The logic chip 202 according to the fifth embodiment is different from that of the first embodiment in that no clock unit 290 is arranged.

Figure 26:
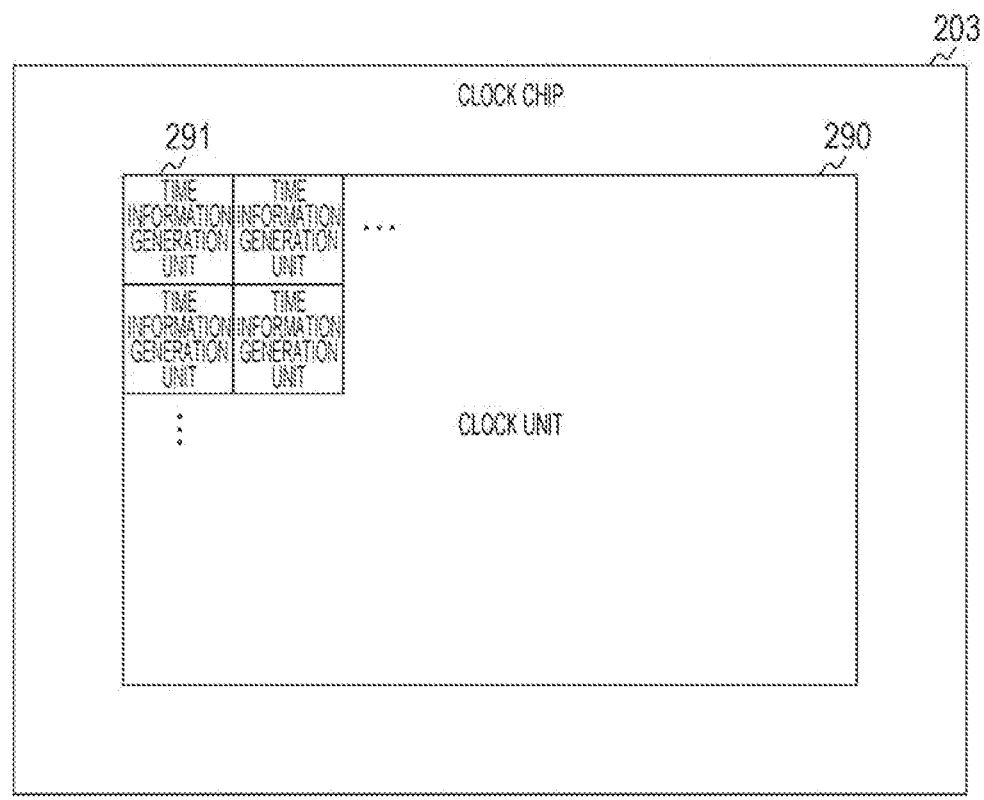
FIG. 26 is a plan view illustrating a configuration example of a clock chip according to the fifth embodiment of the present technology.

FIG. 26 is a plan view illustrating a configuration example of the clock chip 203 according to the fifth embodiment of the present technology. A clock unit 290 is arranged in the clock unit 203. A time information generation unit 291 is arrayed for each pixel circuit 300 in the clock unit 290. These time information generation units 291 are connected to the corresponding pixel circuits 300 on a one-to-one basis.

Note that the circuits in the solid-state image sensor 200 are distributed and arranged on the three chips. However, four or more chips may be provided, and the circuits may be distributed and arranged on the four chips.

As described above, according to the fifth embodiment of the present technology, the circuits in the solid-state image sensor 200 are distributed and arranged on the three chips. Therefore, the circuit scales and areas of the chips can be reduced, as compared with the case of distributing and arranging the circuits on the two chips.

6. Application Example to Moving Body

The technology according to the present disclosure (present technology) can be applied to various products. For example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 27:
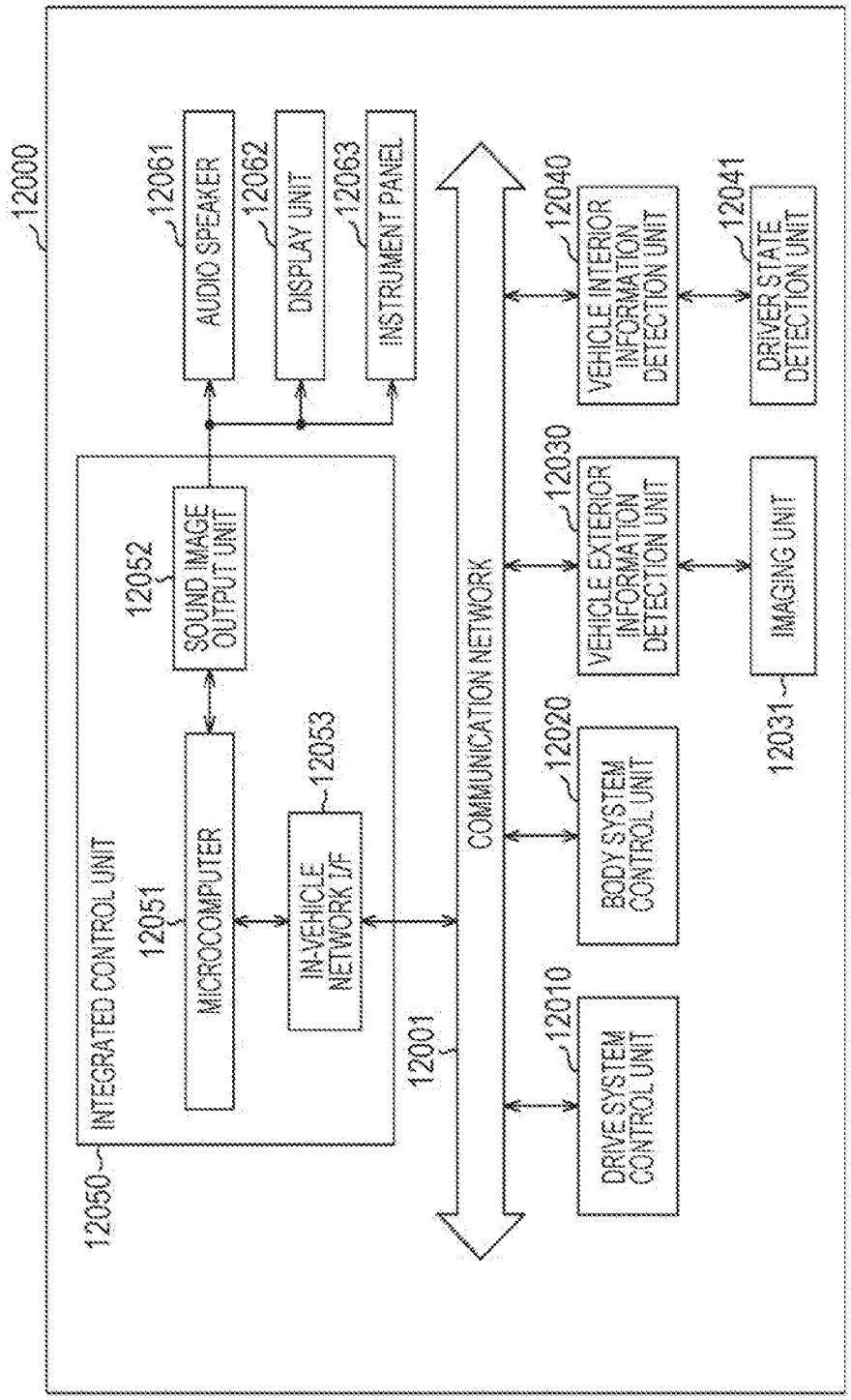
FIG. 27 is a block diagram illustrating a schematic configuration example of a vehicle control system.

FIG. 27 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 27, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to a light reception amount of the light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep at the wheel on the basis of the detection information input from the driver state detection unit 12041.

The microcomputer 12051 calculates a control target value of the drive force generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on a vehicular gap, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information around the vehicle acquired in the vehicle exterior information detection unit 12030 or the vehicle interior information detection unit 12040 to perform cooperative control for the purpose of automatic driving of autonomous travel without depending on an operation of the driver, and the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare by controlling the head lamps according to the position of a leading vehicle or an oncoming vehicle detected in the vehicle exterior information detection unit 12030, switching high beam light to low beam light, and the like.

The sound image output unit 12052 transmits an output signal of at least one of a sound or an image to an output device that can visually and aurally notify a passenger of the vehicle or an outside of the vehicle of information. In the example in FIG. 27, as the output device, an audio speaker 12061, a display unit 12062, and an instrument panel 12063 are exemplarily illustrated. The display unit 12062 may include, for example, at least one of an on-board display or a head-up display.

Figure 28:
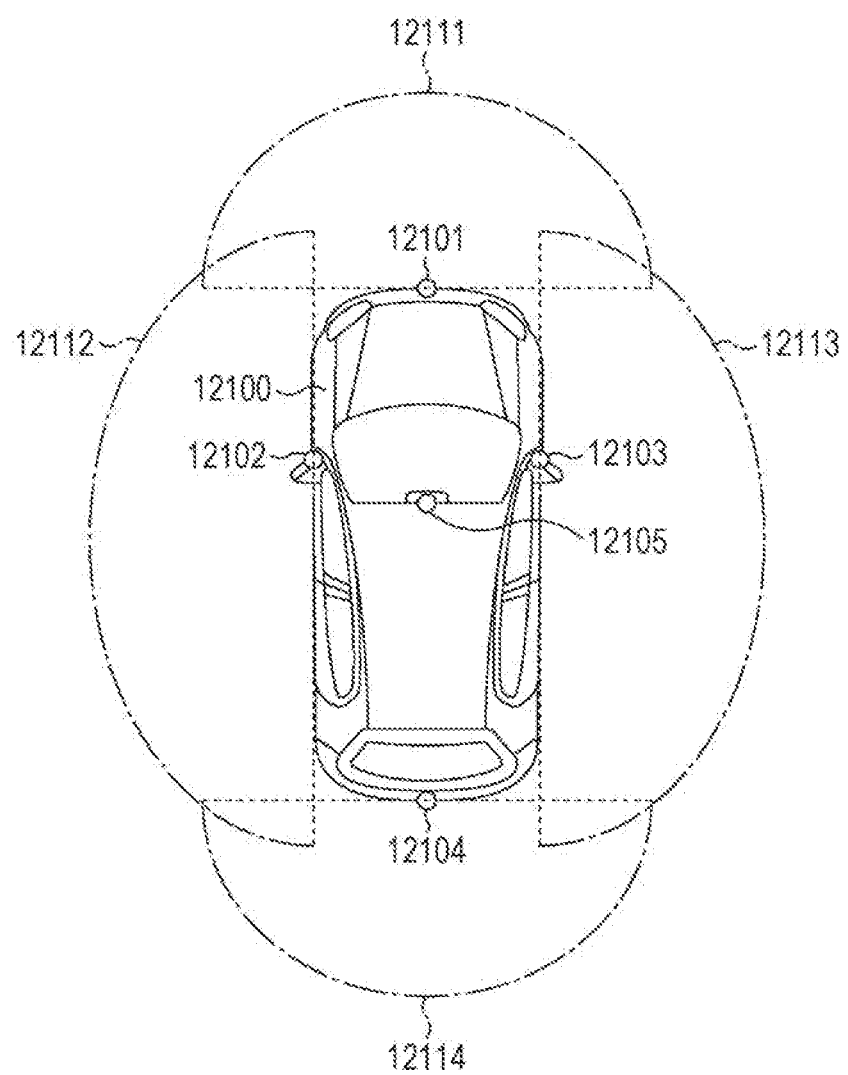
FIG. 28 is an explanatory diagram illustrating an example of installation positions of imaging units.

FIG. 28 is a diagram illustrating an example of an installation position of the imaging unit 12031.

In FIG. 28, imaging units 12101, 12102, 12103, 12104, and 12105 are included as the imaging unit 12031.

The imaging units 12101, 12102, 12103, 12104, and 12105 are provided at positions of a front nose, side mirrors, a rear bumper or a back door, an upper portion of a windshield, and the like in an interior of the vehicle 12100, for example. The imaging unit 12101 provided at the front nose and the imaging unit 12105 provided at an upper portion of the windshield in an interior of the vehicle mainly acquire images in front of the vehicle 12100. The imaging units 12102 and 12103 provided at the side mirrors mainly acquire images on sides of the vehicle 12100. The imaging unit 12104 provided at the rear bumper or the back door mainly acquires an image in back of the vehicle 12100. The imaging unit 12105 provided at the upper portion of the windshield in the interior of the vehicle is mainly used for detecting a preceding vehicle, a pedestrian, an obstacle, a traffic signal, a traffic sign, a lane, or the like.

Note that FIG. 28 illustrates an example of capture ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured in the imaging units 12101 to 12104.

At least one of the imaging units 12101 to 12104 may have a function to acquire distance information. For example, at least one of the imaging units 12101 to 12104 may be a stereo camera including a plurality of image sensors or may be an image sensor having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract a three-dimensional object closest to the vehicle 12100 on a traveling road and traveling at a predetermined speed (for example, 0 km/h or more) in approximately the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic driving of autonomous travel without depending on an operation of the driver, and the like can be performed.

For example, the microcomputer 12051 extracts and classifies three-dimensional object data regarding three-dimensional objects into two-wheeled vehicles, ordinary cars, large vehicles, pedestrians, and other three-dimensional objects such as electric poles, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. The microcomputer 12051 then determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. Such recognition of a pedestrian is performed by a process of extracting characteristic points in the captured images of the imaging units 12101 to 12104, as the infrared camera, for example, and by a process of performing pattern matching processing for the series of characteristic points indicating a contour of an object and determining whether or not the object is a pedestrian. When the microcomputer 12051 determines that a pedestrian exists in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon representing the pedestrian or the like at a desired position.

An example of a vehicle control system to which the technology according to the present disclosure is applicable has been described. The technology according to the present disclosure is applicable to the imaging unit 12031, of the above-described configurations, for example. Specifically, the imaging device 100 in FIG. 1 can be applied to the imaging unit 12031. By applying the technology according to the present disclosure to the imaging unit 12031, power consumption of the system including the imaging unit 12031 can be reduced.

Note that the above-described embodiments describe an example for embodying the present technology, and the matters in the embodiments and the matters used to specify the invention in the claims have correspondence, respectively. Similarly, the matters used to specify the invention in the claims and the matters in the embodiment of the present technology given the same names have correspondence, respectively. However, the present technology is not limited to the embodiments, and can be embodied by application of various modifications to the embodiments without departing from the gist of the present technology.

Note that the effects described in the present specification are merely examples and are not limited, and other effects may be exhibited.

Note that the present technology can also have the following configurations.

(1) A solid-state image sensor including:

a count unit configured to count a number of times a photon has been incident within a predetermined exposure period and output a count value;

a count control unit configured to perform control to stop the count unit and perform a request of time information in a case where the count value has reached a predetermined value before the predetermined exposure period elapses;

a clock unit configured to measure a time and output the time information in response to the request; and an estimation unit configured to estimate a number of incident times of a photon within the predetermined exposure period on the basis of the output time information.

(2) The solid-state image sensor according to (1), in which the count control unit outputs a request requesting the time information to the clock unit in the request of the time information, and the count unit and the count control unit are arranged in each of a plurality of pixel circuits arrayed in a two-dimensional lattice manner.

(3) The solid-state image sensor according to (2), in which the clock unit outputs information indicating a time at which the request has been input by any one of the plurality of pixel circuits or a time to when the request is input from start of exposure as the time information.

(4) The solid-state image sensor according to (2), in which the predetermined value includes a limit value for limiting the count value and an immediately preceding value indicating the count value before reaching the limit value, the count control unit performs control to continuously output the request to the clock unit during a period from when the count value has reached the immediately preceding value to when the count value has reached the limit value and control to stop the count unit when the count value has reached the limit value, the clock unit outputs information indicating each time of times within the period in which the request is being input as the time information, and the estimation unit estimates the number of incident times on the basis of the time information of when the count value has reached the limit value.

(5) The solid-state image sensor according to any one of (1) to (4), in which the clock unit includes a plurality of time information generation units each configured to measure the time and generate the time information, and the plurality of pixel circuits is respectively connected to the time information generation units different from each other.

(6) The solid-state image sensor according to any one of (1) to (4), in which the clock unit includes a plurality of time information generation units each configured to measure the time and generate the time information, and a plurality of lines each including a predetermined number of the pixel circuits arrayed in a predetermined direction is respectively connected to the time information generation units different from each other.

(7) The solid-state image sensor according to any one of (1) to (4), in which the clock unit includes a time information generation unit configured to measure the time and generate the time information, and the plurality of pixel circuits is commonly connected to the time information generation unit.

(8) The solid-state image sensor according to any one of (1) to (6), further including:

a photodiode configured to detect presence or absence of incidence of one photon; and a resistor configured to return a potential of one end of the photodiode to an initial state every time the incidence of one photon is detected, in which the count unit counts a number of times the potential of one end has varied due to the detection of the presence or absence of incidence of one photon.

(9) The solid-state image sensor according to (8), in which the photodiode is an avalanche photodiode.

(10) The solid-state image sensor according to (8), in which the photodiode is arranged on a light receiving chip, and the resistor, the count unit, the count control unit, and the estimation unit are arranged on a logic chip stacked on the light receiving chip.

(11) The solid-state image sensor according to (8), in which the photodiode and the resistor are arranged on a light receiving chip, and the count unit, the count control unit, and the estimation unit are arranged on a logic chip stacked on the light receiving chip.

(12) The solid-state image sensor according to any one of (8) to (11), in which the photodiode is arranged on a light receiving chip, the count unit, the count control unit, and the estimation unit are arranged on a logic chip stacked on the light receiving chip, and the clock unit is arranged on a clock chip stacked on the logic chip.

(13) An imaging device including:

a count unit configured to count a number of times a photon has been incident within a predetermined exposure period and output a count value;

a count control unit configured to perform control to stop the count unit and perform a request of time information in a case where the count value has reached a predetermined value before the predetermined exposure period elapses;

a clock unit configured to measure a time and output the time information in response to the request;

an estimation unit configured to estimate a number of incident times of a photon within the predetermined exposure period on the basis of the output time information and output an estimation value; and a recording unit configured to record image data generated from the estimation value.

(14) A method of controlling a solid-state image sensor, the method including:

a count procedure of counting a number of times a photon has been incident within a predetermined exposure period and output a count value;

a count control procedure of performing control to stop the count unit and performing a request of time information in a case where the count value has reached a predetermined value before the predetermined exposure period elapses;

a clock procedure of measuring a time and outputting the time information in response to the request; and an estimation procedure of estimating a number of incident times of a photon within the predetermined exposure period on the basis of the output time information.

REFERENCE SIGNS LIST

100 Imaging device
110 Imaging lens
120 Recording unit
130 Imaging control unit
200 Solid-state image sensor
201 Light receiving chip
202 Logic chip
203 Clock chip
210 Light receiving unit
220 Light receiving circuit
221 Resistor
222 Photodiode
230 Vertical control unit
240 Horizontal control unit
250 Signal processing unit
260 Logic array unit
270 Logic circuit
271 Inverter
272 Transistor
273 Photon counter
274 Count control unit
275, 278, 294 Switch
276 Estimation unit
277 Time information storage unit
290 Clock unit
291 Time information generation unit
292 Clock circuit
293, 295 Transmission unit
300 Pixel circuit
12031 Imaging unit

The invention claimed is:

1. A solid-state image sensor, comprising:
a clock unit;
a plurality of pixel circuits in a two-dimensional array, wherein
each pixel circuit of the plurality of pixel circuits includes a count unit and a count control unit,
the count unit is configured to:
count a number of times a photon is incident on the solid-state image sensor within an exposure period; and
output a count value based on the count of the number of times the photon is incident,
the count control unit is configured to:
control continuous output of a request to the clock unit in a specific period from a first time instant at which the count value has reached an immediately preceding value to a second time instant at which the count value has reached a limit value, wherein the request is output to the clock unit to request time information from the clock unit, and
the immediately preceding value indicates the count value before the limit value; and
execute control to stop the count unit based on the count value that has reached the limit value, wherein the count value has reached the limit value before elapse of the exposure period,
the clock unit is configured to:
measure a time; and
output the time information based on the request and the measured time, and the time information is output for each time instant within the specific period; and an estimation unit configured to estimate a number of incident times of the photon within the exposure period based on the output time information of the count value that has reached the limit value.

2. The solid-state image sensor according to claim 1, wherein
the clock unit includes a plurality of time information generation units,
each time information generation unit of the plurality of time information generation units is configured to:
measure the time; and
generate the time information based on the measured time,
each pixel circuit of the plurality of pixel circuits is connected to a respective time generation unit of the plurality of time information generation units, and
each time information generation unit of the plurality of time information generation units is different.

3. The solid-state image sensor according to claim 1, further comprising a plurality of lines, wherein
the clock unit includes a plurality of time information generation units,
each time information generation unit of the plurality of time information generation units is configured to:
measure the time; and
generate the time information based on the measured time,
each line of the plurality of lines includes a number of pixel circuits of the plurality of pixel circuits,
each line of the plurality of line is connected to a respective time information generation unit of the plurality of time information generation units, and
each time information generation unit of the plurality of time information generation units is different.

4. The solid-state image sensor according to claim 1, wherein
the clock unit includes a time information generation unit configured to:
measure the time; and
generate the time information based on the measured time, and
the plurality of pixel circuits is commonly connected to the time information generation unit.

5. The solid-state image sensor according to claim 1, further comprising:
a photodiode configured to detect presence or absence of incidence of one photon; and
a resistor configured to return a potential of one end of the photodiode to an initial state every time the incidence of the one photon is detected, wherein
the count unit is further configured to count a number of times the potential of the one end has varied due to the detection of the presence or absence of the incidence of the one photon.

6. The solid-state image sensor according to claim 5, wherein the photodiode is an avalanche photodiode.

7. The solid-state image sensor according to claim 5, further comprising:
a light receiving chip; and
a logic chip on the light receiving chip, wherein
the photodiode is on the light receiving chip, and
the resistor, the count unit, the count control unit, and the estimation unit are on the logic chip.

8. The solid-state image sensor according to claim 5, further comprising:

a light receiving chip; and
a logic chip on the light receiving chip, wherein
the photodiode and the resistor are on the light receiving chip, and
the count unit, the count control unit, and the estimation unit are on the logic chip.

9. The solid-state image sensor according to claim 5, further comprising:
a light receiving chip;
a logic chip on the light receiving chip; and
a clock chip on the logic chip, wherein
the photodiode is on the light receiving chip,
the count unit, the count control unit, and the estimation unit are on the logic chip, and
the clock unit is on the clock chip.

10. An imaging device, comprising:
a clock unit;
a plurality of pixel circuits in a two-dimensional array, wherein
each pixel circuit of the plurality of pixel circuits includes a count unit and a count control unit,
the count unit is configured to:
count a number of times a photon is incident on the imaging device within an exposure period; and
output a count value based on the count of the number of times the photon is incident,
the count control unit is configured to:
control continuous output of a request to the clock unit in a specific period from a first time instant at which the count value has reached an immediately preceding value to a second time instant at which the count value has reached a limit value, wherein
the request is output to the clock unit to request time information from the clock unit, and
the immediately preceding value indicates the count value before the limit value; and
execute control to stop the count unit based on the count value that has reached the limit value, wherein the count value has reached the limit value before elapse of the exposure period,
the clock unit is configured to:
measure a time; and
output the time information based on the request and the measured time, and
the time information is output for each time instant within the specific period; an estimation unit configured to:
estimate a number of incident times of the photon within the exposure period based on the output time information of the count value that has reached the limit value; and
output an estimation value based on the estimation of the number of incident times;
circuitry configured to generate image data based on the estimation value; and
a recording unit configured to record the generated image data.

11. A method of controlling a solid-state image sensor, the method comprising:
counting a number of times a photon is incident on the solid-state image sensor within an exposure period;
outputting a count value based on the count of the number of times the photon is incident;
controlling continuous output of a request to a clock unit in a specific period from a first time instant at which the count value has reached an immediately preceding value to a second time instant at which the count value has reached a limit value, wherein
the request is output to the clock unit to request time information from the clock unit, and
the immediately preceding value indicates the count value before the limit value;

executing control to stop a count unit based on the count value that has reached the limit value, wherein the count value has reached the limit value before elapse of the exposure period;

measuring a time;

outputting the time information based on the request and the measured time, wherein the time information is output for each time instant within the specific period; and estimating a number of incident times of the photon within the exposure period based on the output time information of the count value that has reached the limit value.

* * * * *